(12) United States Patent
Morosawa et al.

(10) Patent No.: US 6,876,353 B2
(45) Date of Patent: Apr. 5, 2005

(54) SHIFT REGISTER AND ELECTRONIC APPARATUS

(75) Inventors: Katsuhiko Morosawa, Higashiyamato (JP); Minoru Kanbara, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 159 days.

(21) Appl. No.: 10/171,953

(22) Filed: Jun. 14, 2002

(65) Prior Publication Data

US 2003/0002615 A1 Jan. 2, 2003

(30) Foreign Application Priority Data

Jun. 29, 2001 (JP) ........................................ 2001-199040

(51) Int. Cl.[7] ................................................. G09G 3/36
(52) U.S. Cl. ........................................ 345/100; 345/98
(58) Field of Search ....................... 345/92–100; 377/54, 377/75–79

(56) References Cited

U.S. PATENT DOCUMENTS

| | | | | |
|---|---|---|---|---|
| 5,222,082 A | * | 6/1993 | Plus ............................. | 377/79 |
| 5,410,583 A | * | 4/1995 | Weisbrod et al. ............. | 377/75 |
| 5,434,899 A | * | 7/1995 | Huq et al. .................... | 377/78 |
| 5,517,542 A | * | 5/1996 | Huq .............................. | 377/78 |
| 5,859,630 A | * | 1/1999 | Huq ............................ | 345/100 |
| 5,949,398 A | * | 9/1999 | Kim ............................ | 345/100 |
| 6,295,046 B1 | * | 9/2001 | Hebiguchi ................... | 345/100 |
| 6,300,928 B1 | * | 10/2001 | Kim ............................ | 345/92 |
| 6,345,085 B1 | * | 2/2002 | Yeo et al. ..................... | 377/54 |
| 6,556,646 B1 | * | 4/2003 | Yeo et al. ..................... | 377/54 |

FOREIGN PATENT DOCUMENTS

JP 2001-160299 A 6/2001

* cited by examiner

*Primary Examiner*—Bipin Shalwala
*Assistant Examiner*—David L. Lewis
(74) *Attorney, Agent, or Firm*—Frishauf, Holtz, Goodman & Chick, P.C.

(57) ABSTRACT

A shift register includes stages, outputting an output signal from each stage. The stage includes a first transistor which outputs an output signal inputted into one terminal from the previous stage via the other terminal, when an output signal is inputted into its control terminal. A second transistor has a control terminal connected to the other terminal of the first transistor, accumulates charges in a capacity of a wiring between the control terminal and the other terminal of the first transistor by a clock signal inputted into one terminal and outputs the clock signal from one terminal. A circuit displaces a potential of the wiring to a predetermined level when the output signal is inputted from the subsequent stage, and holds the potential of the wiring at a predetermined level until the output signal is inputted.

16 Claims, 21 Drawing Sheets

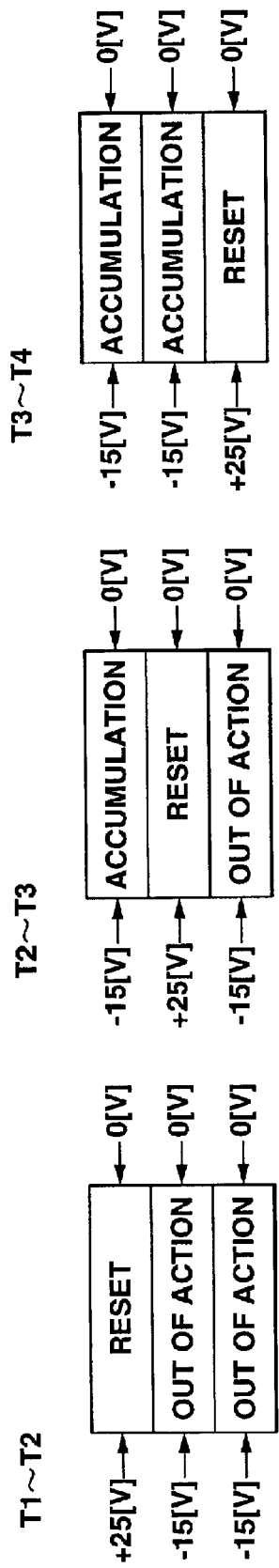
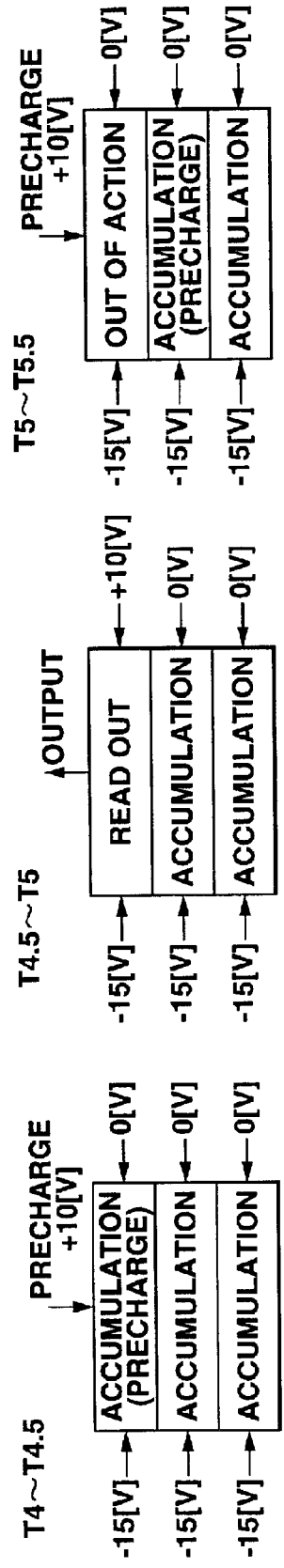
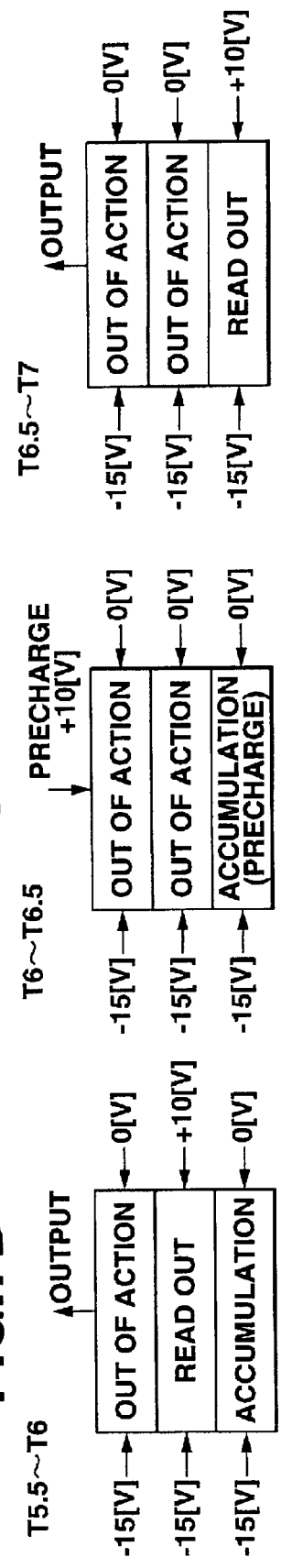

SHIFT REGISTER AND ELECTRONIC APPARATUS

CROSS-REFERENCE TO RELATED APPLICATIONS

This application is based upon and claims the benefit of priority from the prior Japanese Patent Application No. 2001-199040, filed Jun. 29, 2001, the entire contents of which are incorporated herein by reference.

BACKGROUND OF THE INVENTION

1. Field of the Invention

The present invention relates to a shift register which successively outputs an output signal from each stage, and an electronic apparatus which includes the shift register.

2. Description of the Related Art

As a driver for driving an image pickup element and display element in which pixels are arranged in a matrix form, there has been proposed use of a shift register which shifts an output signal successively to a subsequent stage from a previous stage and which linearly and successively outputs the signal to the image pickup element and display element from each stage.

BRIEF SUMMARY OF THE INVENTION

An object of the present invention is to provide a shift register which does not cause a malfunction resulting from a parasitic capacity of a transistor, and an electronic apparatus to which the shift register is applied.

To achieve the object, according to one aspect of the present invention, for example, as shown in FIGS. 4, 5, 8, there is provided a shift register which comprises a plurality of stages, and successively outputs an output signal having a predetermined level from each stage, each stage comprising:

a first transistor (TFT 21) which has a control terminal, and outputs an output signal inputted into one terminal from the previous stage, via the other terminal, when the output signal having the predetermined level is inputted into the control terminal;

a second transistor (TFT 24) which has a control terminal connected to the other terminal of the first transistor, accumulates charges in a capacity having a wiring connected with the control terminal of the second transistor as one pole by a clock signal inputted into one terminal of the second transistor and outputs the clock signal as the output signal of the stage via the other terminal of the second transistor; and a potential holding section (TFT 22, 27, 28, 29, 30, 31, 32, or TFT 22, 33, 34) to displace a potential of the wiring to a predetermined level when an output signal having a predetermined level is inputted from the subsequent stage, and to hold the potential of the wiring at the predetermined level until the output signal having the predetermined level is inputted from the previous stage.

In the shift register, when there is no stage before a foremost stage, the output signal having the predetermined level from the previous stage in the forefront stage may be an output signal having the predetermined level from the last stage, or an output signal having the predetermined level from an external control apparatus. Moreover, when there is no stage after the last stage, the output signal having the predetermined level from the subsequent stage in the last stage may be an output signal having the predetermined level from the forefront stage, or an output signal having the predetermined level from the external control apparatus.

In the shift register, when the output signal having the predetermined level from the previous stage is inputted into the control terminal of the first transistor, the output signal is outputted to the other terminal from one terminal of the first transistor. Here, the potential holding section holds the capacity having the wiring with the output signal with the predetermined level inputted therein from the previous stage via the other terminal of the first transistor as one pole, for example, in a state in which charge-up in a positive potential is possible. Therefore, when the output signal from the previous stage is inputted into the wiring, the charges are held in the capacity. In this case, when the clock signal is inputted into one terminal of the second transistor, the clock signal is outputted to the other terminal of the second transistor as the output signal of the corresponding stage. In this case, due to the charge-up of the parasitic capacity of the second transistor, the potential of the wiring rises. In this manner, the potential of the control terminal of the second transistor is held in a relatively high state. Therefore, without lowering the level of the clock signal, the signal can be outputted from the other terminal. Thus, the shift register constituted in this manner securely shifts the output signal with the level of the clock signal.

Thereafter, when the output signal having the predetermined level is inputted from the subsequent stage, the wiring potential is displaced to a predetermined potential by the potential holding section, and the clock signal inputted into one terminal of the second transistor is not outputted to the other terminal of the second transistor. Before the output signal having the predetermined level is inputted from the previous stage again, the potential of the wiring connected to the control terminal of the second transistor is held by the potential holding section. Therefore, in this case, even if there is an amplitude in the clock signal inputted into one terminal of the second transistor, the wiring potential is synchronized because of the parasitic capacity of the second transistor and can be prevented from being displaced. Thus, a leak current of the second transistor by the clock signal can be prevented. Therefore, the output signal is outputted only when each stage is to output the output signal. The shift register according to the present invention securely shifts the output signal.

The potential holding section may comprise:

a third transistor (TFT 22) which has a control terminal, and displaces the potential of the wiring to a predetermined level in an on state;

a fourth transistor (TFT 29) which has a control terminal, outputs the signal having a predetermined level as an on voltage to the control terminal of the third transistor in response to the output signal from the subsequent stage, and stops the output of the on voltage to the control terminal of the third transistor in response to the output signal from the previous stage; and a fifth transistor (TFT 28) which has a control terminal, outputs a signal having a predetermined level as an off voltage to the control terminal of the third transistor in response to the output signal from the previous stage, and stops the output of the off voltage to the control terminal of the third transistor in response to the output signal from the subsequent stage.

The potential holding section may comprise:

a sixth transistor (TFT 32) which has a control terminal, and outputs a signal having a predetermined level as an on voltage to the control terminal of the fourth transistor in response to the output signal from the subsequent stage;

a seventh transistor (TFT 31) which has a control terminal, and outputs a signal having a predetermined level as an off voltage to the control terminal of the fourth in response to the output signal from the previous stage;

an eighth transistor (TFT 27) which has a control terminal, and outputs a signal having a predetermined level as an on voltage to the control terminal of the fifth transistor in response to the output signal from the previous stage; and a ninth transistor (TFT 30) which has a control terminal, and outputs a signal having a predetermined level as an off voltage to the control terminal of the fifth transistor in response to the output signal from the subsequent stage.

With the potential holding section constituted as described above, when the output signal having the predetermined level is inputted from the subsequent stage, charges for determining the potential of the control terminal of the fourth transistor are accumulated via the sixth transistor, and the fourth transistor is turned on. Therefore, the signal of the on voltage is outputted to the control terminal of the third transistor via the fourth transistor. Moreover, when the output signal having the predetermined level is inputted from the subsequent stage, the on voltage of the control terminal of the fifth transistor is displaced to an off potential by the ninth transistor. The fifth transistor is turned off, and by the signal with a constant voltage level outputted from the other terminal of the fourth transistor, the control terminal of the third transistor is set to the on potential. Therefore, the third transistor sets the potential of the wiring connected to the control terminal of the second transistor to a reference voltage Vss. Here, when the clock signal is inputted into one terminal of the second transistor, due to the parasitic capacity of the second transistor, the charges are accumulated in the capacity. However, since the wiring potential of the control terminal of the second transistor is held at the reference voltage Vss, the leak current is not generated from the second transistor. Therefore, when the output signal having the predetermined level is inputted from the subsequent stage, the output signal is not outputted from the corresponding stage by the clock signal. Thereafter, when the output signal having the predetermined level is inputted from the previous stage, the potential of the control terminal of the fourth transistor is displaced to the predetermined potential by the seventh transistor. Thereby, the fourth transistor stops the output of the signal having a constant voltage level. Moreover, when the output signal having the predetermined level is inputted from the previous stage, the potential of the control terminal of the fifth transistor is set to the on potential by the eighth transistor. The wiring potential connected to the control terminal of the third transistor is displaced to the predetermined potential by the fifth transistor, and the third transistor is turned off. Therefore, the wiring potential connected to the control terminal of the second transistor is displaced by the output signal having the predetermined level from the previous stage. In this case, when the clock signal is inputted to one terminal of the second transistor, the clock signal is outputted as the output signal of the stage to the other terminal of the second transistor. In this case, when the clock signal is inputted to one terminal of the second transistor, due to the parasitic capacity of the second transistor, the wiring potential connected to the second transistor is further displaced. Thereby, without lowering the level of the clock signal, the second transistor outputs the signal to the other terminal. Therefore, the shift register constituted in this manner securely shifts the output signal while the level of the output signal is the level of the clock signal.

For example, as shown in FIG. 10, the potential holding section may comprise:

a third transistor (TFT 22) which has a control terminal, and displaces the potential of the wiring to a predetermined level in the on state;

a tenth transistor (TFT 33) which has a control terminal, and outputs a signal as the on voltage to the control terminal of the third transistor, when the output signal from the subsequent stage is inputted into one terminal and the control terminal of the tenth transistor; and an eleventh transistor (TFT 34) which has a control terminal, and outputs a signal as the off voltage to the control terminal of the third transistor in response to the output signal from the previous stage.

In the shift register constituted in this manner, when the output signal having the predetermined level is inputted from the subsequent stage, the charges are accumulated in the control terminal of the third transistor by the eleventh transistor, for example, so as to apply a positive potential. Therefore, the third transistor is in a state for discharging the charges to determine the wiring potential connected to the control terminal of the second transistor. Here, when the clock signal is inputted into one terminal of the second transistor, due to the parasitic capacity of the second transistor, the charges are accumulated in the capacity having the wiring connected to the control terminal of the second transistor as one pole. However, the third transistor can set the wiring potential to the constant voltage. Therefore, the leak current is not generated from the second transistor from when the output signal having the predetermined level is inputted from the subsequent stage until the output signal is inputted from the previous stage again. Thereafter, when the output signal having the predetermined level is inputted from the previous stage, the third transistor stops the discharge of the charges accumulated in one pole of the parasitic capacity of the second transistor by the tenth transistor, and the charges are accumulated in one pole of the parasitic capacity of the second transistor. In this case, when the clock signal is inputted to one terminal of the second transistor, the clock signal is outputted as the output signal of the stage to the other terminal of the second transistor. In this case, when the clock signal is inputted into one terminal of the second transistor, due to the parasitic capacity of the second transistor, the charges are accumulated in the wiring capacity, and the wiring potential is further displaced. Therefore, without lowering the level of the clock signal, the second transistor outputs the signal to the other terminal. Therefore, the shift register having this constitution securely shifts the output signal with the level of the clock signal.

According to another aspect of the present invention, for example, as shown in FIGS. 4, 12, there is provided a shift register which is constituted of a plurality of stages (stages RS(1) to RS(n)), and successively outputs an output signal having a predetermined level from each stage, each stage comprising:

a first transistor (TFT 41) which outputs an output signal inputted into one terminal from the previous stage, when the output signal having a predetermined level is inputted into a control terminal from the previous stage;

a second transistor (TFT 44) whose control terminal is connected to the other terminal of the first transistor, and which accumulates charges in a capacity having a wiring connected with the control terminal of the second transistor as one pole by a clock signal inputted into one terminal of the second transistor and outputs the clock signal as the output signal of the stage via the other terminal of the second transistor;

a third transistor (TFT 45) which has a control terminal, and outputs a second voltage as the output signal of the stage, when a first voltage is supplied to the control terminal of the third transistor from a first voltage wiring;

a fourth transistor (TFT 43) which outputs an off voltage to the control terminal of the third transistor in response to the output signal outputted to the wiring from the other terminal of the first transistor;

a fifth transistor (TFT 42) which displaces the potential of the wiring to a predetermined level in response to the output signal having the predetermined level from the subsequent stage; and a capacitor (capacitor 47) disposed between the wiring and the other terminal of the second transistor.

Here, for example, as shown in FIG. 15, each stage may include a second capacitor (capacitor 48) disposed between the wiring and a second constant voltage wiring which supplies the second constant voltage.

For example, as shown in FIGS. 16, 18, each stage may include a third capacitor (capacitor 49) disposed between the wiring and the first constant voltage wiring.

For example, as shown in FIGS. 17, 19, each stage may include a fourth capacitor (capacitor 50) in which one pole is grounded and the other pole is connected to the wiring.

In the shift register, when there is no stage before the forefront stage, the output signal having the predetermined level from the previous stage in the forefront stage may be an output signal having the predetermined level from the last stage, or an output signal having the predetermined level from an external control apparatus. Moreover, when there is no stage after the last stage, the output signal having the predetermined level from the subsequent stage in the last stage may be an output signal having the predetermined level from the forefront stage, or an output signal having the predetermined level from the external control apparatus.

The above-described respective shift registers are stabilized and the leak current of the second transistor by the amplitude by the clock signal can be suppressed, when the capacitor having the wiring connected to the control terminal of the second transistor as one pole. Particularly in the shift register according to the another aspect, when the second transistor has n channels, the potential of the control terminal of the second transistor can be prevented from dropping.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

FIGS. 7A to 7I are schematic diagrams showing the operation of the image pickup apparatus.

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Concrete modes of a shift register and electronic apparatus according to an embodiment of the present invention will be described hereinafter with reference to the drawings.

Additionally, the scope of the present invention is not limited to shown examples.

First Embodiment

Figure 1:
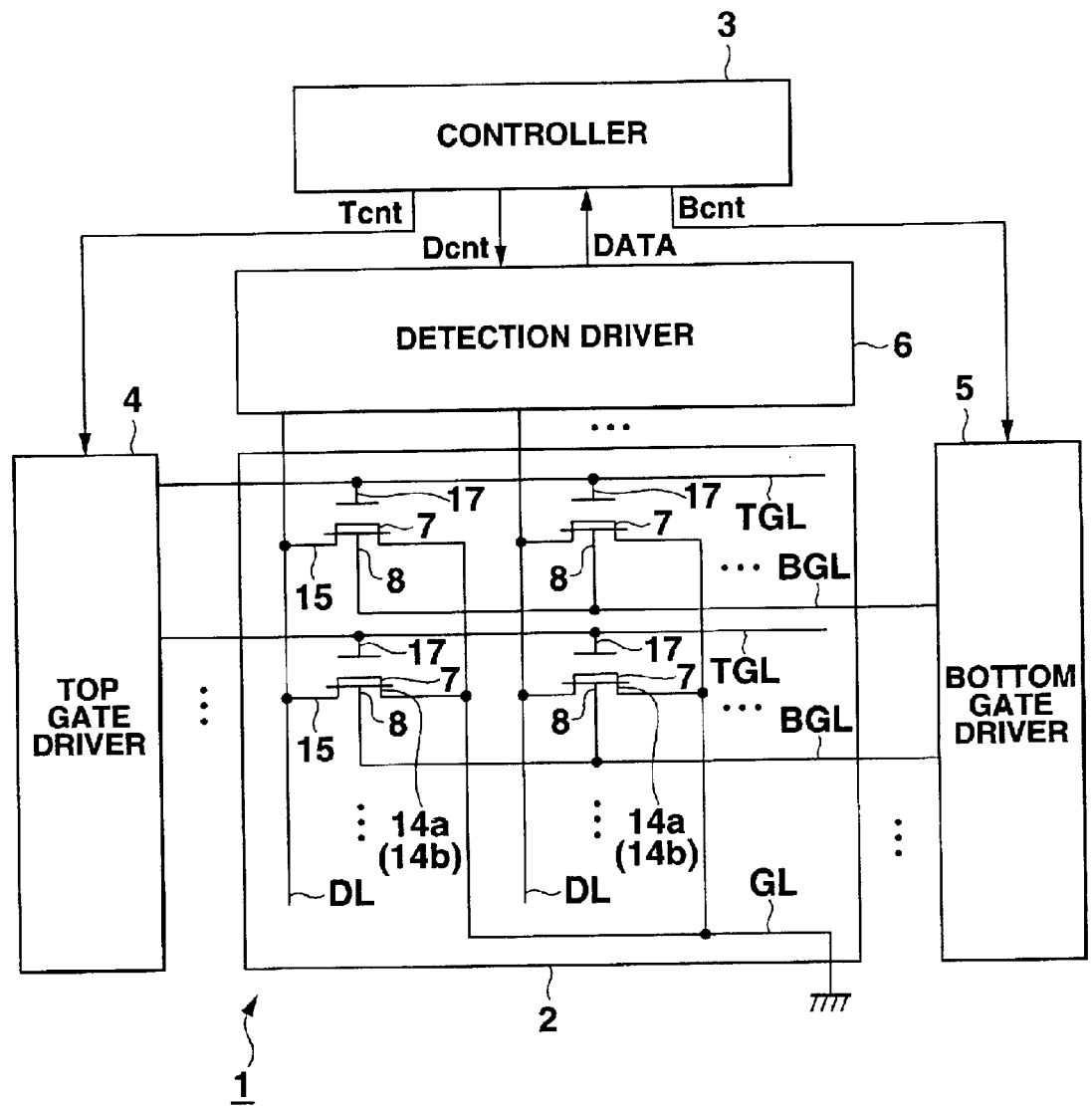
FIG. 1 is a block diagram showing a concrete constitution of an image pickup apparatus to which an electronic apparatus according to the present invention is applied.

As shown in FIG. 1, an image pickup apparatus 1 to which the electronic apparatus according to one embodiment of the present invention is applied is basically constituted of: an image pickup element array 2 for optically sensing and picking up (acquiring) an image; a controller 3 for controlling the whole image pickup apparatus 1; a top gate driver 4 for driving the image pickup element array 2 in response to a control signal from the controller 3; a bottom gate driver 5; and a detection driver 6. The top gate driver 4, bottom gate driver 5 and detection driver 6 are connected to the controller 3 so that data can be inputted/outputted.

Figure 2:
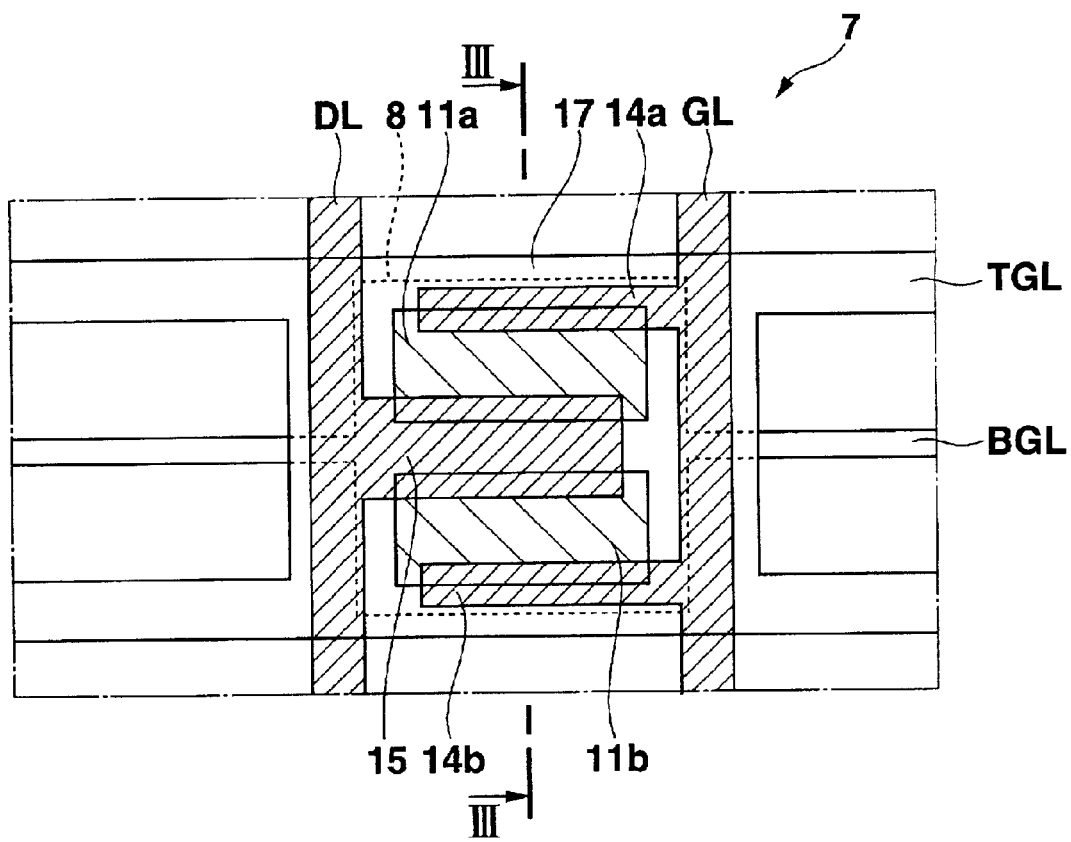
FIG. 2 is a plan view showing a concrete mode of a double gate type transistor constituting an image pickup element array disposed in the image pickup apparatus shown in FIG. 1.
Figure 3:
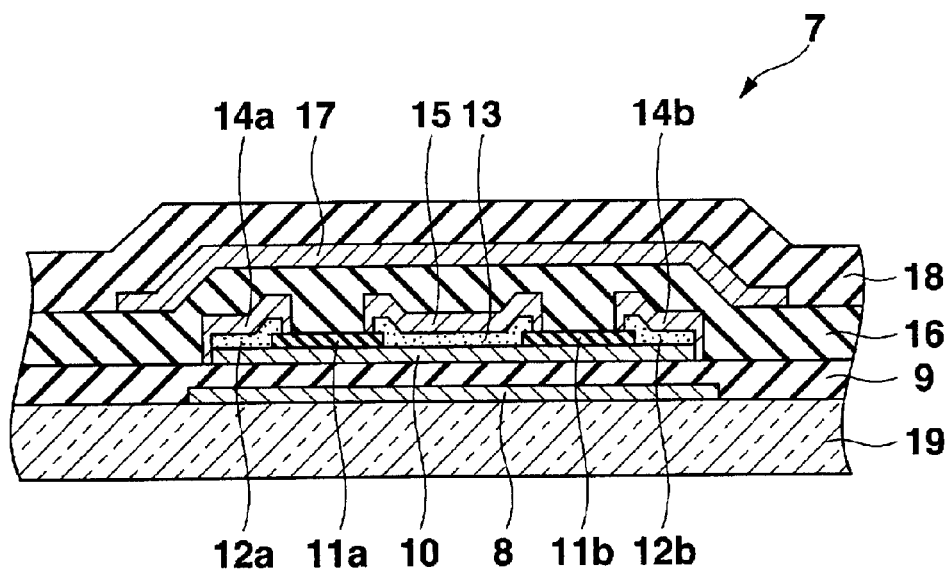
FIG. 3 is a sectional view cut along a III—III line in FIG. 2, in which the concrete mode of the double gate type transistor shown in FIG. 2 is shown.

The image pickup element array 2 is basically constituted of a large number of double gate type transistors 7 arranged in a matrix form on a transparent substrate. As shown in FIGS. 2 and 3, each double gate type transistor 7 includes a bottom gate electrode 8, bottom gate insulation film 9, semiconductor layer 10, block insulation films 11a, 11b, impurity doped layers (semiconductor layers doped with impurities) 12a, 12b, 13, source electrodes 14a, 14b, drain electrode 15, top gate insulation film 16, top gate electrode 17, and protective insulation film 18.

The bottom gate electrode 8 is formed on a transparent substrate 19. The transparent substrate 19 has a permeability to a visible light and an electric insulating property. The bottom gate insulation film 9 is disposed on the bottom gate electrode 8 and transparent substrate 19 so that the bottom gate electrode 8 and transparent substrate 19 are coated. The semiconductor layer 10 is disposed opposite to the bottom gate electrode 8 on the bottom gate insulation film 9. The semiconductor layer 10 is formed of amorphous silicon. When the visible light is incident upon the semiconductor layer 10, electron-positive hole pairs are generated in the semiconductor layer 10.

In the semiconductor layer 10, the block insulation films 11a, 11b are disposed apart from each other and in the same plane. The impurity doped layer 12a is disposed on one end of the semiconductor layer 10 in a channel longitudinal direction, and the impurity doped layer 12b is disposed on the other end thereof. The impurity doped layer 13 is disposed on a middle of the semiconductor layer 10 between the block insulation films 11a and 11b. The impurity doped layer 13 is apart from the pair of impurity doped layers 12a, 12b. Therefore, the semiconductor layer 10 is entirely coated with the impurity doped layers 12a, 12b, 13 and block insulation films 11a, 11b. A portion of the impurity doped layer 12a overlaps one end of a portion of the block insulation film 11a, and the impurity doped layer 12b overlaps one end of the block insulation film 11b. The impurity doped layers 12a, 12b, 13 are formed of amorphous silicon doped with n-type impurities.

The source electrodes 14a, 14b are disposed on the impurity doped layers 12a, 12b, respectively, and the drain electrode 15 is disposed on the impurity doped layer 13. One source electrode 14a overlaps a portion of the block insulation film 11a, the other source electrode 14b overlaps a portion of the block insulation film 11b, and the drain electrode 15 overlaps portions of the block insulation films 11a, 11b. The source electrodes 14a, 14b are apart from the drain electrode 15. The top gate insulation film 16 is formed so that the bottom gate insulation film 9, block insulation films 11a, 11b, source electrodes 14a, 14b and drain electrode 15 are coated. The top gate electrode 17 disposed opposite to the semiconductor layer 10 is mounted on the top gate insulation film 16. The protective insulation film 18 covers the top gate insulation film 16 and top gate electrode 17.

Each double gate type transistor 7 constituted as described above has both photo sense function and photoelectric conversion function. That is, the double gate type transistor 7 has the photo sense function of accumulating the positive holes of the electron-positive hole pairs having an amount generated in accordance with a light amount incident upon the semiconductor layer 10 by a portion constituted of the semiconductor layer 10, source electrodes 14a, 14b, drain electrode 15, top gate insulation film 16 and top gate electrode 17. Moreover, the transistor has the photoelectric conversion function of displacing a voltage of a drain line DL in accordance with the amount of positive holes accumulated by the photo sense function by the transistor portion constituted of the semiconductor layer 10, source electrodes 14a, 14b, drain electrode 15, bottom gate insulation film 9 and bottom gate electrode 8.

As shown in FIGS. 1 and 2, the top gate electrode 17 is connected to a top gate line TGL, the bottom gate electrode 8 is connected to a bottom gate line BGL, the drain electrode 15 is connected to the drain line DL, and the source electrodes 14a, 14b are connected to a grounded ground line GL.

The block insulation films 11a, 11b, top gate insulation film 16 and protective insulation film 18 are formed of materials having translucency and insulating property, such as silicon nitride. The top gate electrode 17 and top gate line TGL are formed of materials having translucency and conductivity such as indium-tin-oxide (ITO). The source electrodes 14a, 14b, drain electrode 15, bottom gate electrode 8 and bottom gate line BGL are formed of materials which are selected from chromium, chromium alloy, aluminum, and aluminum alloy, and which cut off the transmission of the visible light and have conductivity.

Here, as shown in FIG. 1, the top gate driver 4 is connected to each top gate line TGL of the image pickup element array 2, successively and selectively outputs a driving signal (i.e., the output signal) to each top gate line TGL, and appropriately applies a reset voltage (+25 [V]) or a carrier accumulated voltage (−15 [V]) as the driving signal to the top gate line TGL in accordance with a control signal group Tcnt outputted from the controller 3.

The bottom gate driver 5 is connected to the bottom gate line BGL of the image pickup element array 2, successively and selectively outputs the driving signal (i.e., the output signal) to each bottom gate line BGL, and appropriately applies a channel forming voltage (+10 [V]) or a channel non-forming voltage (±0 [V]) as the driving signal to the bottom gate line BGL in accordance with a control signal group Bcnt outputted from the controller 3.

The detection driver 6 is connected to each data line DL of the image pickup element array 2, applies a reference voltage (+10 [V]) to all the data lines DL in response to a control signal group Dcnt outputted from the controller 3 in a predetermined period, and precharges electric charges. The detection driver 6 detects a potential of the data line DL which changes in accordance with the light amount incident upon each double gate type transistor 7 or a drain current flowing between a source and drain of the double gate type transistor 7 in a predetermined period after the precharge, and outputs a data signal DATA to the controller 3.

Figure 4:
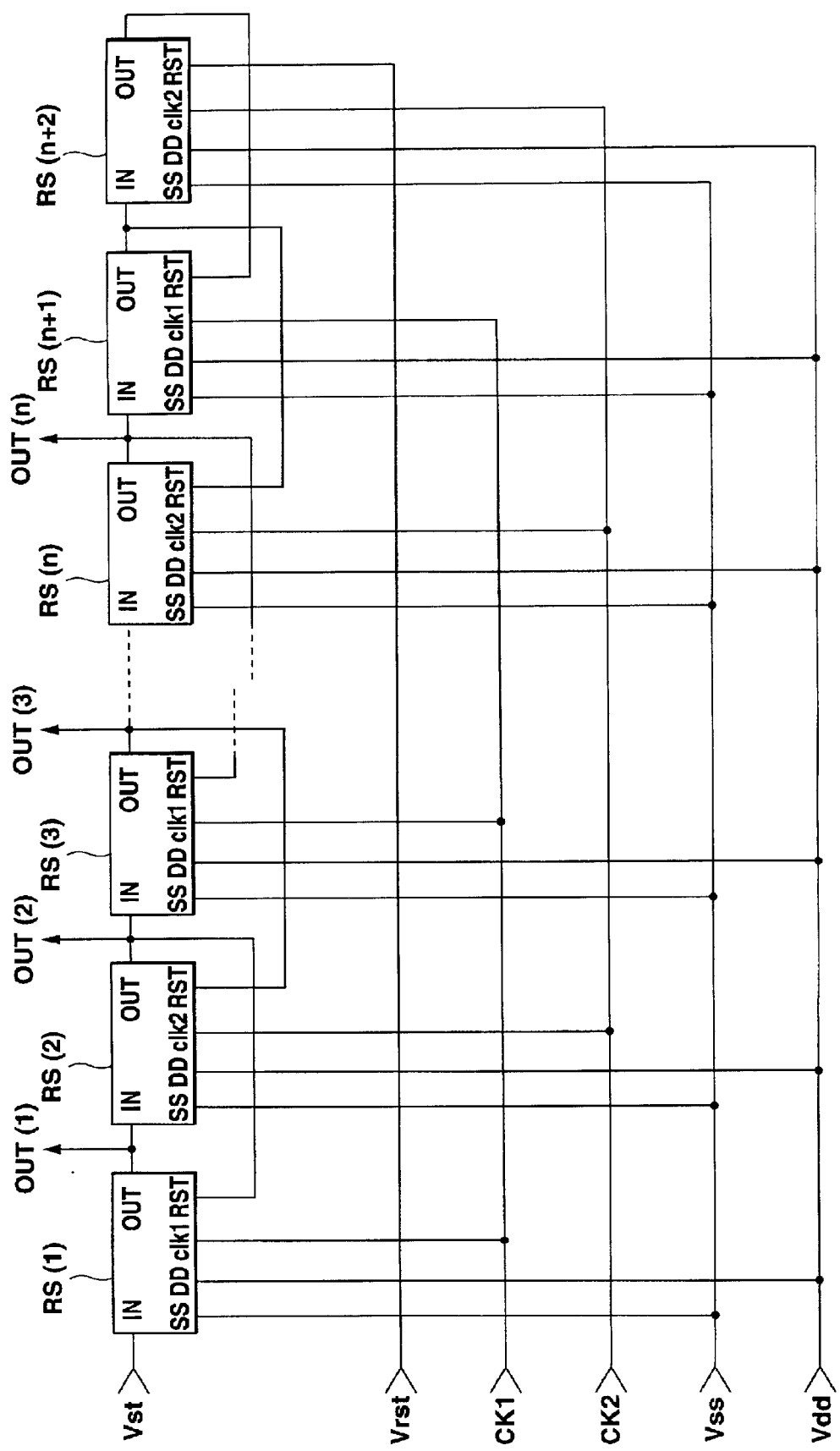
FIG. 4 is a block diagram showing a whole concrete constitution of a top gate driver or a bottom gate driver disposed in the image pickup apparatus shown in FIG. 1.

Details of the top gate driver 4 and bottom gate driver 5 will next be described. FIG. 4 is a block diagram showing a shift register according to the present invention. The shift register according to the embodiment of the present invention is applied to the top gate driver 4 and bottom gate driver 5. When the number of rows of double gate type transistors 7 (i.e., the number of top gate lines TGL) arranged in the image pickup element array 2 is n, the top gate driver 4 and bottom gate driver 5 have the shift register constituted of n stages RS(1) to RS(n) for outputting output signals to gate lines and dummy stages RS(n+1) to RS(n+2) not outputting the output signals to the gate lines.

A stage RS(k) has an input signal terminal IN, output signal terminal OUT, reference voltage applied terminal SS, constant voltage applied terminal DD, clock signal input terminal clk (clk1 or clk2) and reset signal input terminal RST. Here, k denotes integers of 1 to n, a stage RS(1) denotes a first stage, stage RS(2) denotes a second stage, and stage RS(n) denotes an n-th stage.

The output signal terminal OUT of the stage RS(k) is a terminal which outputs an output signal out(k) of the stage RS(k). When the shift register shown in FIG. 4 is the top gate driver 4, the output signal terminal OUT of the stage RS(k) is connected to the corresponding top gate line TGL (i.e., the top gate line TGL of a k-th row), and the output signal out(k) is outputted to the corresponding top gate line TGL. On the other hand, when the shift register shown in FIG. 4 is the bottom gate driver 5, the output signal terminal OUT of the stage RS(k) is connected to the corresponding bottom gate line BGL (i.e., the bottom gate line BGL of the k-th row), and the output signal out(k) is outputted to the corresponding bottom gate line BGL.

The input signal terminal IN of the first stage RS(1) is a terminal into which a start signal Vst from the controller 3 is inputted. When the shift register shown in FIG. 4 is the top gate driver 4, a high level of the start signal Vst is +25 [V], and a low level of the start signal Vst is −15 [V]. Instead, when the shift register shown in FIG. 4 is the bottom gate driver, the high level of the start signal Vst is +10 [V], and the low level of the start signal Vst is ±0 [V]. The input signal terminals IN of the stages RS(k) (i.e., k denotes 2 to n) other than the first stage are connected to the output signal terminal OUT of the previous stage RS(k−1), and an output signal out(k−1) of the previous stage RS(k−1) is inputted as an input signal.

Output signals OUT(2) to OUT(n+2) from subsequent stages RS(2) to RS(n+2) are inputted as reset signals into the reset signal input terminals RST of the stages RS(1) to RS(n+1) other than the stage RS(n+2), and a reset signal Vrst from the controller 3 is inputted to the reset signal input terminal RST of the stage RS(n+2). When the shift register shown in FIG. 4 is the top gate driver 4, the high level of the reset signal Vrst is +25 [V], and the low level of the reset signal Vrst is −15 [V]. Instead, when the shift register shown in FIG. 4 is the bottom gate driver, the high level of the reset signal Vrst is +10 [V], and the low level of the reset signal Vrst is ±0 [V].

The reference voltage applied terminal SS of the stage RS(k) is a terminal to which the reference voltage Vss is supplied from the controller 3. When the shift register shown in FIG. 4 is the top gate driver 4, the level of the reference voltage Vss is −15 [V]. On the other hand, when the shift register shown in FIG. 4 is the bottom gate driver 5, the level of the reference voltage Vss is ±0 [V]. The constant voltage applied terminal DD of the stage RS(k) is a terminal to which a constant voltage Vdd is supplied from the controller 3. When the shift register shown in FIG. 4 is the top gate driver 4, the level of the constant voltage Vdd is +25 [V]. On the other hand, when the shift register shown in FIG. 4 is the bottom gate driver 5, the level of the constant voltage Vdd is +10 [V].

Figure 6:
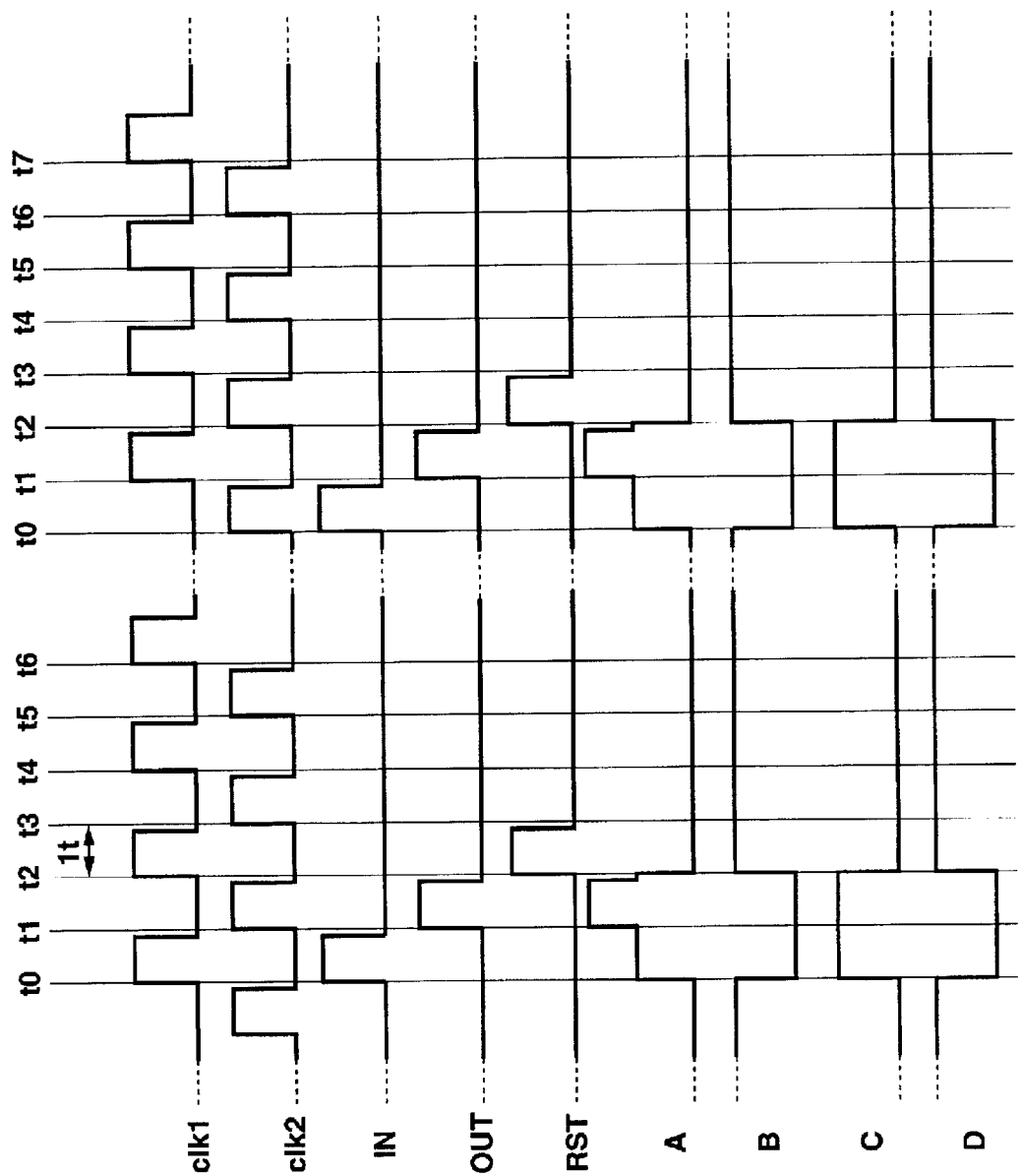
FIG. 6 is a timing chart showing an operation of the top gate driver or bottom gate driver.

A clock signal CK1 from the controller 3 is inputted to a clock signal input terminal clk1 of an odd-numbered (i.e., k denotes an odd number) stage RS(k). A clock signal CK2 is inputted to a clock signal input terminal clk2 of an even-numbered (i.e., k denotes an even number) stage RS(k). As shown in FIG. 6, each of the clock signals CK1, CK2 alternately indicates the high level in a predetermined time of the time slot for shifting the output signal of the shift register every time slot. That is, when the clock signal CK1 indicates the high level for the predetermined time in one time slot, the clock signal CK2 indicates the low level in the time slot. In the next time slot, the clock signal CK1 indicates the low level and the clock signal CK2 indicates the high level for the predetermined period.

When the shift register shown in FIG. 4 constitutes the top gate driver 4, the clock signals CK1, CK2 indicate the high level of +25 [V], and the low level of −15 [V]. On the other hand, when the shift register shown in FIG. 4 is applied to the bottom gate driver 5, the high level is +10 [V], and the low level is ±0 [V].

Figure 5:
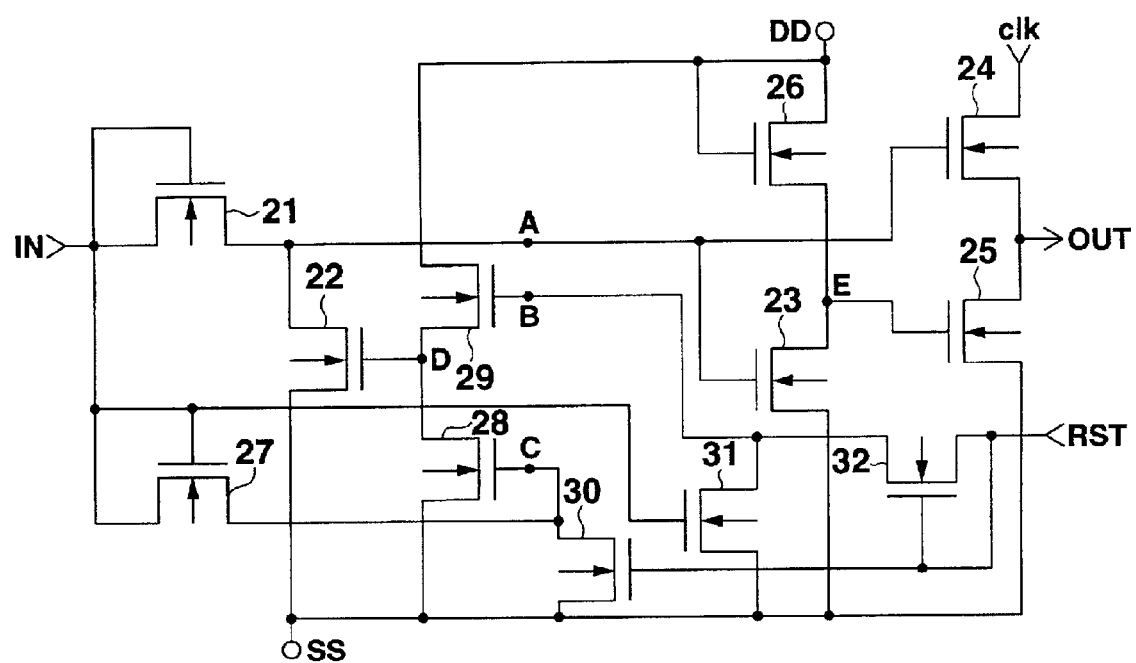
FIG. 5 is a diagram showing a concrete mode of a circuit constitution of each stage of the top gate driver or bottom gate driver shown in FIG. 4.

As shown in FIG. 5, each of the stages RS(1) to RS(n+2) is basically constituted of six thin film transistors (hereinafter referred to as TFT) 21 to 26, and additionally constituted of six TFTs 27 to 32. Each of the TFTs 21 to 32 is an n-channel MOS type field-effect transistor, silicon nitride is used in the gate insulation film, and amorphous silicon is used in the semiconductor layer. Concretely, a sectional structure of the double gate type transistor 7 will be described with reference to FIG. 3. The TFTs 21 to 32 are transistors in which the top gate electrodes 17 are not laminated.

As shown in FIG. 5, gate and drain electrodes of the TFT 21 are connected to the input signal terminal IN, and the source electrode of the TFT 21 is connected to the gate electrode of the TFT 24, the gate electrode of the TFT 23 and the drain electrode of the TFT 22. In a wiring via which the gate electrode of the TFT 24, gate electrode of the TFT 23, drain electrode of the TFT 22 and source electrode of the TFT 21 are respectively connected, parasitic capacities are generated between the TFT 21 and the TFTs 23, 24. In a node A as an optional point of the wiring, the potential can be displaced in accordance with the charges accumulated in the parasitic capacity generated between the wiring and the TFT 24.

The drain electrode of the TFT 24 is connected to the clock signal input terminal clk, and the source electrode of the TFT 24 is connected to the output signal terminal OUT. The drain electrode of the TFT 23 is connected to the source electrode of the TFT 26 and gate electrode of the TFT 25. The source electrode of the TFT 23 is connected to the reference voltage applied terminal SS. In the wiring via which the drain electrode of the TFT 23, gate electrode of the TFT 25 and source electrode of the TFT 26 are respectively connected, the parasitic capacities are generated among the TFTs 23, 25, 26. A node E as an optional point is positioned in the wiring.

The drain electrode of the TFT 25 is connected to the output signal terminal OUT, and the source electrode of the TFT 25 is connected to the reference voltage applied terminal SS. The drain and gate electrodes of the TFT 26 are connected to the constant voltage applied terminal DD. The gate and drain electrodes of the TFT 27 are connected to the input signal terminal IN, and the source electrode of the TFT 27 is connected to the gate electrode of the TFT 28 and drain electrode of the TFT 30. In the wiring connected to the gate electrode of the TFT 28, source electrode of the TFT 27 and drain electrode of the TFT 30, the parasitic capacities are generated among the TFTs 27, 28, 30. A node C as the optional point is positioned in the wiring.

The gate electrode of the TFT 30 is connected to the reset signal input terminal RST, and the source electrode of the TFT 30 is connected to the reference voltage applied terminal SS. The drain electrode of the TFT 28 is connected to the gate electrode of the TFT 22 and source electrode of the TFT 29, and the source electrode of the TFT 28 is connected to the reference voltage applied terminal SS. In the wiring via which the gate electrode of the TFT 22, drain electrode of the TFT 28 and source electrode of the TFT 29 are connected to one another, the parasitic capacities are generated among the TFTs 22, 29, 28. A node D as the optional point is positioned in the wiring.

The source electrode of the TFT 22 is connected to the reference voltage applied terminal SS. The drain electrode of the TFT 29 is connected to the constant voltage applied terminal DD, and the gate electrode of the TFT 29 is connected to the drain electrode of the TFT 31 and source electrode of the TFT 32. In the wiring via which the gate electrode of the TFT 29, drain electrode of the TFT 31 and source electrode of the TFT 32 are connected to one another, the parasitic capacities are generated among the TFTs 29, 31, 32. A node B as the optional point is positioned in the wiring. The drain and gate electrodes of the TFT 32 are commonly connected to the reset signal input terminal RST. The gate electrode of the TFT 31 is connected to the input signal terminal IN, and the source electrode of the TFT 31 is connected to the reference voltage applied terminal SS.

The output signal out(k−1) from the previous stage RS(k−1) is inputted as the input signal (additionally, k denotes 2 to n), or the start signal Vst from the controller 3 is inputted as the input signal (additionally, k denotes 1) to the gate and drain electrodes of the TFT 21. When the output signal out(k−1) or the start signal Vst has a high level, the TFT 21 is turned on, the current flows to the source electrode from the drain electrode of the transfer 21, and the TFT 21 outputs the high-level output signal out(k−1) to the source electrode. Here, when the TFT 22 has an off state, the node A is set to the high level by the output signal out(k−1) indicating the high level outputted from the source electrode of the TFT 21. On the other hand, when the output signal out(k−1) or the start signal Vst indicates the low level, the TFT 21 has the off state, and the current does not flow between the drain and source electrodes of the TFT 21.

The constant voltage Vdd is supplied to the gate and drain electrodes of the TFT 26. Thereby, the TFT 26 constantly has the on state, the current flows between the drain and source electrodes of the TFT 26, and the TFT 26 outputs the signal having a substantially constant voltage Vdd level to the source electrode. The TFT 26 has a function of a load for dividing the constant voltage Vdd.

The TFT 23 has the off state, when the node A indicates the low level. The node E is set to the high level by the signal outputted from the source electrode of the TFT 26 and having the substantially constant voltage Vdd level. On the other hand, the TFT 23 has the on state, when the node A indicates the high level. When the current flows between the drain and source electrodes of the TFT 23, the TFT 23 sets the potential of the node E to the reference voltage Vss. The TFT 25 has the off state with the node E indicating the low level, and has the on state with the node E indicating the high level. The TFT 24 has the on state with the node A indicating the high level, and has the off state with the node A indicating the low level. Therefore, when the TFT 25 is in the off state, the TFT 24 has the on state. When the TFT 25 is in the on state, the TFT 24 has the off state.

The reference voltage Vss is supplied to the source electrode of the TFT 25. The TFT 25 in the on state outputs the signal having a reference voltage Vss level (i.e., the low level) to the output signal terminal OUT from the drain electrode, and outputs the signal having the low level as the output signal out(k) of the stage RS(k). When the TFT 25 is in the off state, the output signal out(k) of the stage RS(k) indicates the level of the signal outputted from the source electrode of the TFT 24.

The clock signal CK1 or CK2 is inputted to the drain electrode of the TFT 24. When the TFT 24 is in the off state, the output of the clock signal CK1 or CK2 inputted to the drain electrode is cut off.

When the TFT 24 is in the on state, and the low-level clock signal CK1 or CK2 is inputted into the drain electrode of the TFT 24, the TFT 24 outputs the low-level clock signal CK1 or CK2 to the source electrode. Here, when the TFT 24 is in the on state, the TFT 25 has the off state. The low-level clock signal CK1 or CK2 is outputted as the output signal out(k) of the stage RS(k).

On the other hand, when the TFT 24 is in the on state, and the high-level clock signal CK1 or CK2 is inputted to the drain electrode of the TFT 24, the charges are accumulated in the parasitic capacity constituted by the gate and source electrodes and the gate insulation film between the electrodes. In this case, since the TFT 21 of the stage RS(k) has the off state, the potential of the node A rises by a boot strap effect. When the potential of the node A reaches a gate saturated voltage of the TFT 24, a source-drain current of the TFT 24 is saturated. Thereby, the TFT 24 in the on state outputs the signal indicating substantially the same potential as that of the high-level clock signal CK1 or CK2 to the source electrode. Here, when the TFT 24 is in the on state, the TFT 25 has the off state. Therefore, the high-level clock signal CK1 or CK2 is outputted as the output signal out(k) of the stage RS(k).

When the node D is in the high level, the TFT 22 has the on state, sets the potential of the node A to the reference voltage Vss, and maintains this state. On the other hand, when the node D is in the low level, the TFT 22 has the off state. Since the period of the off state of the node A does not overlap that of the node D in this manner, the wiring of the node A is not brought to a floating state.

The reset signal is inputted into the drain and gate electrodes of the TFT 32. Additionally, with the stages RS(k) other than the dummy stage RS(n+2), the reset signal is the output signal out(k+1) of the subsequent stage RS(k+1). With the dummy stage RS(n+2), the reset signal is a reset signal Vrst outputted from the controller 3.

When the high-level reset signal is inputted to the gate electrode of the TFT 32, the TFT 32 is turned on, and the current flows between the drain and source electrodes of the TFT 32. Thereby, the TFT 32 in the on state outputs the high-level reset signal inputted into the drain electrode to the source electrode. Here, when the TFT 31 is in the off state, the high-level reset signal outputted from the source electrode of the TFT 32 brings the node B into the high level. The TFT 31 is turned on/off by the input signal. That is, when the high-level input signal is inputted to the gate electrode of the TFT 31, the TFT 31 is turned on, and sets the potential of the node B to the reference voltage Vss. On the other hand, when the low-level input signal is inputted into the gate electrode of the TFT 31, the TFT 31 is turned off, and the potential of the node B can be brought into the high level. The constant voltage Vdd is supplied to the drain electrode of the TFT 29. When the node B is in the high level, the TFT 29 is turned on, and the current flows between the drain and source electrodes of the TFT 29. Thereby, the TFT 29 outputs the signal with the constant voltage Vdd inputted to the drain electrode, to the source electrode from the drain electrode. On the other hand, when the TFT 31 brings the node B into the low level, the TFT 29 is turned off, and the output of the signal with the constant voltage Vdd level to the source electrode is stopped.

Therefore, from when the high-level reset signal is inputted into the reset signal input terminal RST until the high-level input signal is inputted into the input signal terminal IN, the TFT 29 maintains the on state. On the other hand, from when the high-level input signal is inputted into the input signal terminal IN until the high-level reset signal is inputted into the reset signal input terminal, the TFT 29 maintains the off state.

When the TFT 28 is in the off state, by the signal having the constant voltage Vdd level outputted from the source electrode of the TFT 29, the node D holds the high level, and thus the TFT 22 is turned on. The TFT 28 is turned on/off by the TFTs 27 and 30. That is, when the high-level input signal is inputted into the gate electrode of the TFT 27, the TFT 27 is turned on, while the high-level input signal inputted into the drain electrode is outputted to the source electrode. On the other hand, when the low-level input signal is inputted into the gate electrode of the TFT 27, the TFT 27 is turned off. Here, when the TFT 30 is in the off state, the high-level input signal outputted from the source electrode of the TFT 27 brings the node C into the high level. When the high-level reset signal is inputted into the gate electrode of the TFT 30, the TFT 30 is turned on, and the current flows between the drain and source electrodes of the TFT 30. Thereby, the TFT 30 discharges the charges accumulated in the node C, and the TFT 28 is turned on. On the other hand, when the low-level reset signal is inputted into the gate electrode of the TFT 30, the TFT 30 is turned off. When the high-level input signal is inputted into the TFT 27, the node C is brought into the high level. Therefore, from when the high-level input signal is inputted into the input signal terminal IN until the high-level reset signal is inputted into the reset signal input terminal RST, the TFT 28 maintains the on state. On the other hand, from when the high-level reset signal is inputted into the reset signal input terminal RST until the high-level input signal is inputted into the input signal terminal IN, the TFT 28 maintains the off state.

Thereby, from when the high-level reset signal is inputted until the high-level input signal is inputted, the node D maintains the high level state. In this result, the TFT 22 maintains the on state, and thus the wiring of the node A does not have the floating state. On the other hand, from when the high-level input signal is inputted until the high-level reset signal is inputted, the node D maintains the low level state, and the TFT 22 maintains the off state.

After the stages RS(1) to RS(n) respectively output the output signals out(1) to out(n), the output signal from the dummy stage RS(n+1) is inputted into the reset signal input terminal RST of the stage RS(n), and the potential of the node A of the stage RS(n) indicates the reference potential Vss. Subsequently, the output signal from the dummy stage RS(n+2) is inputted into the reset signal input terminal RST of the dummy stage RS(n+1), and the potential of the node A of the dummy stage RS(n+1) indicates the reference potential Vss. Finally, when the reset signal Vrst from the controller 3 is inputted to the reset signal input terminal RST of the dummy stage RS(n+2), the potential of the node A of the dummy stage RS(n+1) is the reference potential Vss. The potentials of the nodes A of all the stages RS(1) to RS(n+2) indicate the reference potentials Vss, and one scanning period of the shift register ends.

An operation of the image pickup apparatus 1 according to the present embodiment will be described hereinafter. First, the operation of the top gate driver 4 and bottom gate driver 5 will be described with reference to FIGS. 5 and 6. In the figures, a period for it is one selection period. The top gate driver 4 is presumed in the following description. However, since the top gate driver 4 is different from the bottom gate driver 5 only in the level and timing of the inputted/outputted signals, the top gate driver can be replaced by the bottom gate driver 5. For the operation of the bottom gate driver 5, only the part different from that of the top gate driver 4 will be described.

Moreover, in the following description, the even-numbered stages other than the dummy stage RS(n+2) will be described as examples. However, when the reset signal Vrst from the controller 3 is inputted as the reset signal (i.e., the output signal out(k+1)), the dummy stage RS(n+2) is the same as the other even-numbered stages. Moreover, even the odd-numbered stage performs the same operation as that of the even-numbered stage, when the inputted clock signal CK2 is replaced with the clock signal CK1. The first stage is also the same as the other even-numbered stages except that the input signal (i.e., the output signal out(k−1)) is the start signal Vst from the controller 3. Additionally, as described above, the level of the reference voltage Vss supplied to the reference voltage applied terminal SS of each stage of the top gate driver 4 is −15 [V]. However, even when the level of the reference voltage Vss is 0 [V], the operation is substantially the same.

As shown in FIGS. 5 and 6, before a timing t0, the reset signal (i.e., the output signal out(k+1)) inputted to the reset signal input terminal RST of the stage RS(k) from the subsequent stage RS(k+1) indicates the high level (i.e., +25 [V]). While the reset signal is in the high level, the TFT 32 is turned on, and the potential of the node B rises. When the potential of the node B rises, the TFT 29 is turned on. Moreover, for this period, the TFT 30 is turned on, and thereby the TFT 28 is turned off. Therefore, the signal having the level of the constant voltage Vdd (i.e., +25 [V]) is outputted into the source electrode of the TFT 29, and the potential of the node D rises. Thus, the TFT 22 is turned on, and the potential of the node A indicates the reference voltage Vss (i.e., the low level).

Thereafter, the reset signal is brought into the low level, and the TFTs 30, 32 are turned off. However, since the node B is maintained in the high level, the TFT 29 maintains the on state, and the charges are accumulated in the node D (i.e., the node D is maintained in the high level). Therefore, the TFT 22 maintains the on state. In this case, the input signal inputted into the input signal terminal IN (i.e., the output signal out(k−1) from the previous stage RS(k−1)) does not have the high level. Thus, the TFTs 27, 30, 31, 21 are in the off state, and the nodes A and C are not in the high level.

Subsequently, at the timing t0, the input signal inputted to the input signal terminal IN is brought into the high level, and the TFTs 27, 31 are turned on. When the TFT 31 is turned on, the potential of the node B drops, and the TFT 29 is turned off. On the other hand, when the TFT 27 is turned on, the high-level input signal inputted to the drain electrode of the TFT 27 is outputted to the source electrode, and the node C indicates the high level. When the potential of the node C rises, the TFT 28 is turned on. Therefore, the charges accumulated in the node D are discharged, and the TFT 22 is turned off.

Moreover, from the timing t0, the TFT 21 is turned on, and the high-level input signal inputted to the drain electrode of the TFT 21 is outputted to the source electrode. Since the TFT 22 is in the off state, the high-level input signal outputted from the source electrode of the TFT 21 allows the potential of the node A to rise. Thus, the TFTs 23, 24 are turned on. When the TFT 23 is turned on, the node E indicates the reference voltage Vss, and the TFT 25 is turned off. In this manner, since the TFT 24 is in the on state and the TFT 25 is in the off state, the clock signal CK2 which is to be inputted to the drain electrode of the TFT 24 is outputted as the output signal out(k) of the stage RS(k) via the output signal terminal OUT.

After the timing t0 and immediately before a timing t1, the input signal of the stage RS(k) is brought into the low level by the TFT 25 of the previous stage RS(k−1), and the TFTs 21, 27 are turned off. In this time, the node C maintains the high level, and the nodes B, D remain in the low level. Therefore, even when the input signal is brought into the low level, the TFT 22 maintains the off state, the potential of the node A is held in the high level, and the TFTs 23, 24 maintain the on state.

Subsequently, when the clock signal CK2 is brought into the high level (+25 [V]) at the timing t1, and a drain current flows in the TFT 24, with the rise of the potential of the source electrode, the parasitic capacity constituted of the gate and source electrodes of the TFT 24 and the gate insulation film between the electrodes is charged up. When the boot strap effect allows the potential of the node A to further rise and to reach the gate saturated voltage of the TFT 24, the current flowing between the drain and source electrodes of the TFT 24 is saturated. Thereby, the output signal out(k) outputted from the output signal terminal OUT of the stage RS(k) has the high level of +25 [V] which is substantially the same potential as that of the clock signal CK2. In a period in which the clock signal CK2 is in the high level, the parasitic capacity of the TFT 24 is charged up, and the potential of the node A substantially reaches +45 to +50 [V].

Subsequently, after the timing t1 and immediately before the timing t2, the clock signal CK2 is brought into the low level (−15 [V]). Thereby, the output signal out(k) also has a level of about −15 [V]. Moreover, the electric charges charged into the parasitic capacity of the TFT 24 are discharged, and the potential of the node A drops.

Next, at a timing t2, the reset signal inputted in the reset signal input terminal RST reaches the high level. Thereby, the TFTs 30, 32 are turned on. When the TFT 32 is turned on, the high-level reset signal inputted into the drain electrode of the TFT 32 is outputted to the source electrode. The high-level reset signal outputted to the source electrode brings the node B into the high level, and turns on the TFT 29. On the other hand, when the TFT 30 is turned on, the potential of the node C drops, and the TFT 28 is turned off.

When the TFT 29 is turned on, the signal having the constant voltage Vdd level is outputted to the source electrode of the TFT 29. Here, since the TFT 28 is in the off state, the signal outputted to the source electrode of the TFT 29 and having the constant voltage Vdd level brings the node D into the high level. Therefore, the TFT 22 is turned on. When the TFT 22 is turned on, the node A is brought into the low level. Thereby, the TFTs 23, 24 are turned off. When the TFT 24 is turned off, the output of the clock signal CK2 inputted to the drain electrode of the TFT 24 is cut off. When the TFT 23 is turned off, the signal having the constant voltage Vdd level is outputted to the source electrode of the TFT 26, and the node E is brought into the high level, the TFT 25 is turned on. Thereby, the signal with the reference voltage Vss level is outputted as the output signal out(k) of the stage RS(k) via the output signal terminal OUT.

Immediately before a timing t3 after the timing t2, the TFT 32 is turned off, and the TFT 30 is turned off, but the node B is in the high level. Therefore, since the TFT 29 maintains the on state, and the node D remains in the high level, the TFT 22 maintains the on state. That is, the node D maintains the high level, until the input signal inputted to the input signal terminal IN reaches the high level at the next timing to. During this time, the node A constantly indicates the reference voltage Vss without being in the floating state. Therefore, from the timing t2 till the next timing t0, the high-level clock signal CK2 (the clock signal CK1 in the odd-numbered stage) is outputted to the TFT 24 of the stage RS(k). Even when the potential of the node A is to rise by the parasitic capacity between the gate and source of the TFT 24, the potential is offset by the reference voltage Vss. Therefore, the TFT 24 can maintain the off state. The output signal is not vibrated by the clock signal CK2 or CK1 and can maintain a normal waveform.

When the operation is successively repeated in both the odd-numbered and even-numbered stages, the stage to output the high-level output signal successively shifts to the next stage.

The operation of the bottom gate driver 5 is substantially the same as the operation of the top gate driver 4. However, the high level of the clock signal CK1, CK2 inputted from the controller 3 is +10 [V]. Therefore, the high level of the output signal out(k) of each stage RS(k) is about +10 [V], and the level of the node A in this case is of the order of +18 to +20 [V]. A period for which the clock signal CK1, CK2 of the bottom gate driver 5 is in the high level is shorter than a period for which the clock signal CK1, CK2 of the top gate driver 4 is in the high level.

The whole operation for driving the image pickup element array 2 and picking up an image will next be described with reference to schematic diagrams of FIGS. 7A to 7I. Additionally, in the following description, a period of 1T has the same length as that of one horizontal period. To simplify the description, first three rows of transistors are considered in a large number of double gate type transistors 7 arranged in the image pickup element array 2.

First, in the period of 1T from a timing T1 until T2, as shown in FIG. 7A, the top gate driver 4 supplies +25 [V] to the top gate line TGL of the first row, and supplies −15 [V] to the top gate lines TGL of the second and third rows (all the other rows). That is, the high-level output signal is outputted from the output signal terminal OUT of the stage RS(1) of the top gate driver 4, and the low-level output signals are outputted from the output signal terminals OUT of the stages RS(2), RS(3). On the other hand, the bottom gate driver 5 supplies 0 [V] to all the bottom gate lines BGL. That is, the low-level output signals are outputted from the output signal terminals OUT of the RS(1) to RS(3) of the bottom gate driver 5. In this period, the double gate type transistor 7 of the first row is brought into a reset state, and the double gate type transistors 7 of the second and third rows are in a stat in which a read-out state in a previous vertical period ends (a photo sense is not influenced).

Subsequently, in a period of 1T from a timing T2 till T3, as shown in FIG. 7B, the high-level output signal shifts to the stage RS(2) of the top gate driver 4, and the top gate driver 4 supplies +25 [V] to the top gate line TGL of the second row, and supplies −15 [V] to the other top gate lines TGL. On the other hand, the bottom gate driver 5 supplies 0 [V] to all the bottom gate lines BGL. In this period, the double gate type transistor 7 of the first row is brought into a photo sense state, the double gate type transistor 7 of the second row is brought into the reset state, and the double gate type transistor 7 of a third row is brought into the state in which the read-out state in the previous vertical period ends (the photo sense is not influenced).

Subsequently, in a period of 1T from a timing T3 till T4, as shown in FIG. 7C, the high-level output signal shifts to the stage RS(3) of the top gate driver 4, and the top gate driver 4 supplies +25 [V] to the top gate line TGL of the third row, and supplies −15 [V] to the other top gate lines TGL. On the other hand, the bottom gate driver 5 supplies 0 [V] to all the bottom gate lines BGL. In this period, the double gate type transistors of the first and second rows are brought into the photo sense state, and the double gate type transistor 7 of the third row is brought into the reset state.

Subsequently, in a period of 0.5T from a timing T4 till T4.5, as shown in FIG. 7D, the top gate driver 4 supplies −15 [V] to all the top gate lines TGL. On the other hand, the bottom gate driver 5 supplies 0 [V] to all the bottom gate lines BGL. Moreover, the detection driver 6 supplies +10 [V] to all the data lines DL. In this period, the double gate type transistors 7 of all the rows are brought into the photo sense state.

Subsequently, in a period of 0.5T from a timing T4.5 till T5, as shown in FIG. 7E, the top gate driver 4 supplies −15 [V] to all the top gate lines TGL. On the other hand, the bottom gate driver 5 supplies +10 [V] to the bottom gate line BGL of the first row, and supplies 0 [V] to the other bottom gate lines BGL. That is, the high-level output signal is outputted from the output signal terminal OUT of the stage RS(1) of the bottom gate driver 5, and the low-level output signals are outputted from the output signal terminals OUT of the stages RS(2), RS(3). In this period, the double gate type transistor 7 of the first row is brought into the first or second read-out state, and the double gate type transistors 7 of the second and third rows remain in the photo sense state.

Here, in the double gate type transistor 7 of the first row, when the semiconductor layer 10 is irradiated with a sufficient light in the period of the timing T2 till T4.5 in the photo sense state, an n-channel is formed in the semiconductor layer 10 in the second read-out state, and the electric charges on the corresponding data line DL are therefore discharged. On the other hand, when the semiconductor layer 10 is not irradiated with the sufficient light in the period of the timing T2 till T4.5, the n-channel in the semiconductor layer 10 is pinched off in the first read-out state, and therefore the electric charges on the corresponding data line DL are not discharged. In the period of the timing T4.5 till T5, the detection driver 6 reads out the potential on each data line DL, and supplies the potential as image data DATA detected by the double gate type transistors 7 of the first row to the controller 3.

Subsequently, in a period of 0.5T from timing T5 till T5.5, as shown in FIG. 7F, the top gate driver 4 applies −15 [V] to all the top gate lines TGL. On the other hand, the bottom gate driver 5 applies 0 [V] to all the bottom gate lines BGL. Moreover, the detection driver 6 applies +10 [V] to all the data lines DL. In this period, the double gate type transistor 7 of the first row has ended the read-out, and the double gate type transistors 7 of the second and third rows are brought into the photo sense state. Between the timings T5 and T5.5, the high-level output signal of the stage RS(1) of the bottom gate driver 5 is inputted into the stage RS(2), but the clock signal inputted into the stage RS(2) does not reach the high level. Since the output signal is not outputted from the stage RS(2), 0[V] is supplied to the bottom gate line BGL of the second row.

Subsequently, in a period of 0.5T from a timing T5.5 till T6, as shown in FIG. 7G, the top gate driver 4 supplies −15 [V] to all the top gate lines TGL. On the other hand, the high-level output signal shifts to the stage RS(2) of the bottom gate driver 5, and the bottom gate driver 5 supplies +10 [V] to the bottom gate line BGL of the second row, and supplies 0 [V] to the other bottom gate lines BGL. In this period, the double gate type transistor 7 of the first row is in the state of the ended read-out, the double gate type transistor 7 of the second row is in the first or second read-out state, and the double gate type transistor 7 of the third row is in the photo sense state.

Here, in the double gate type transistors 7 of the second row, when the semiconductor layer 10 is irradiated with the sufficient light in the period of the timing T3 till T5.5 in the photo sense state, the n-channel is formed in the semiconductor layer 10 in the second read-out state, and the electric charges on the corresponding data line DL are therefore discharged. On the other hand, when the semiconductor layer 10 is not irradiated with the sufficient light in the period of the timing T3 till T5.5, the n-channel in the semiconductor layer 10 is pinched off in the first read-out state, and therefore the electric charges on the corresponding data line DL are not discharged. In the period of the timing T5.5 till T6, the detection driver 6 reads out the potential on each data line DL, and supplies the potential as the image data DATA detected by the double gate type transistor 7 of the second row to the controller 3.

Subsequently, in a period of 0.5T from timing T6 till T6.5, as shown in FIG. 7H, the top gate driver 4 supplies −15 [V] to all the top gate lines TGL. On the other hand, the bottom gate driver 5 supplies the detection driver 6 supplies +10 [V] to all the data lines DL. In this period, the double gate type transistors 7 of the first and second rows are brought into the state in which the read-out has ended, and the double gate type transistor 7 of the third row is brought into the photo sense state.

Subsequently, in a period of 0.5T from a timing T6.5 till T7, as shown in FIG. 7I, the top gate driver 4 supplies −15 [V] to all the top gate lines TGL. On the other hand, the high-level output signal shifts to the stage RS(3) of the bottom gate driver 5, and the bottom gate driver 5 supplies +10 [V] to the bottom gate line BGL of the third row, and supplies 0 [V] to the other bottom gate lines BGL. In this period, the double gate type transistors 7 of the first and second rows are brought into the state in which the read-out has ended, and the double gate type transistor 7 of the third row is brought into the first or second read-out state.

Here, in the double gate type transistor 7 of the third row, when the semiconductor layer 10 is irradiated with the sufficient light in the period of the timing T4 till T6.5 in the photo sense state, the n-channel is formed in the semiconductor layer 10 in the second read-out state, and the electric charges on the corresponding data line DL are therefore discharged. On the other hand, when the semiconductor layer 10 is not irradiated with the sufficient light in the period of the timing T4 till T6.5, the n-channel in the semiconductor layer 10 is pinched off in the first read-out state, and therefore the electric charges on the corresponding data line DL are not discharged. In the period of the timing T6.5 till T7, the detection driver 6 reads out the potential on each data line DL, and supplies the potential as the image data DATA detected by the double gate type transistor 7 of the third row to the controller 3.

When the image data DATA supplied to each row from the detection driver 6 in this manner is subjected to a predetermined processing of the controller 3, image data of an image pick-up object is generated.

An effect of the present invention will next be described. The stage RS(k) of the top gate driver 4 or the bottom gate driver 5 of the present embodiment is constituted by adding the TFTs 27 to 32 to the stage shown in FIG. 8. That is, in the stage shown in FIG. 8, the reset signal input terminal is directly connected to the gate electrode of the TFT 22. On the other hand, in the stage RS(k) of the present embodiment, the TFTs 27 to 32 are disposed between the gate electrode of the TFT 22 and the reset signal input terminal RST or the input signal terminal IN.

Figure 8:
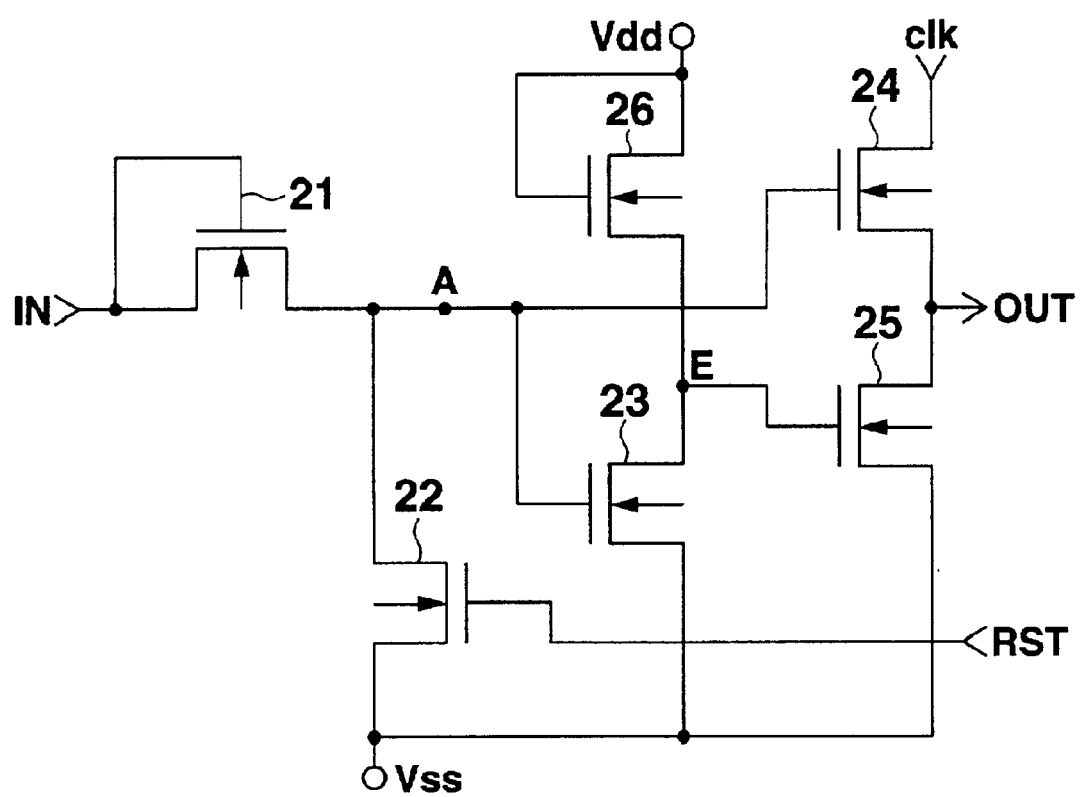
FIG. 8 is a diagram showing the concrete mode of the circuit constitution of each stage of the top gate driver or bottom gate driver as a comparative example.
Figure 9:
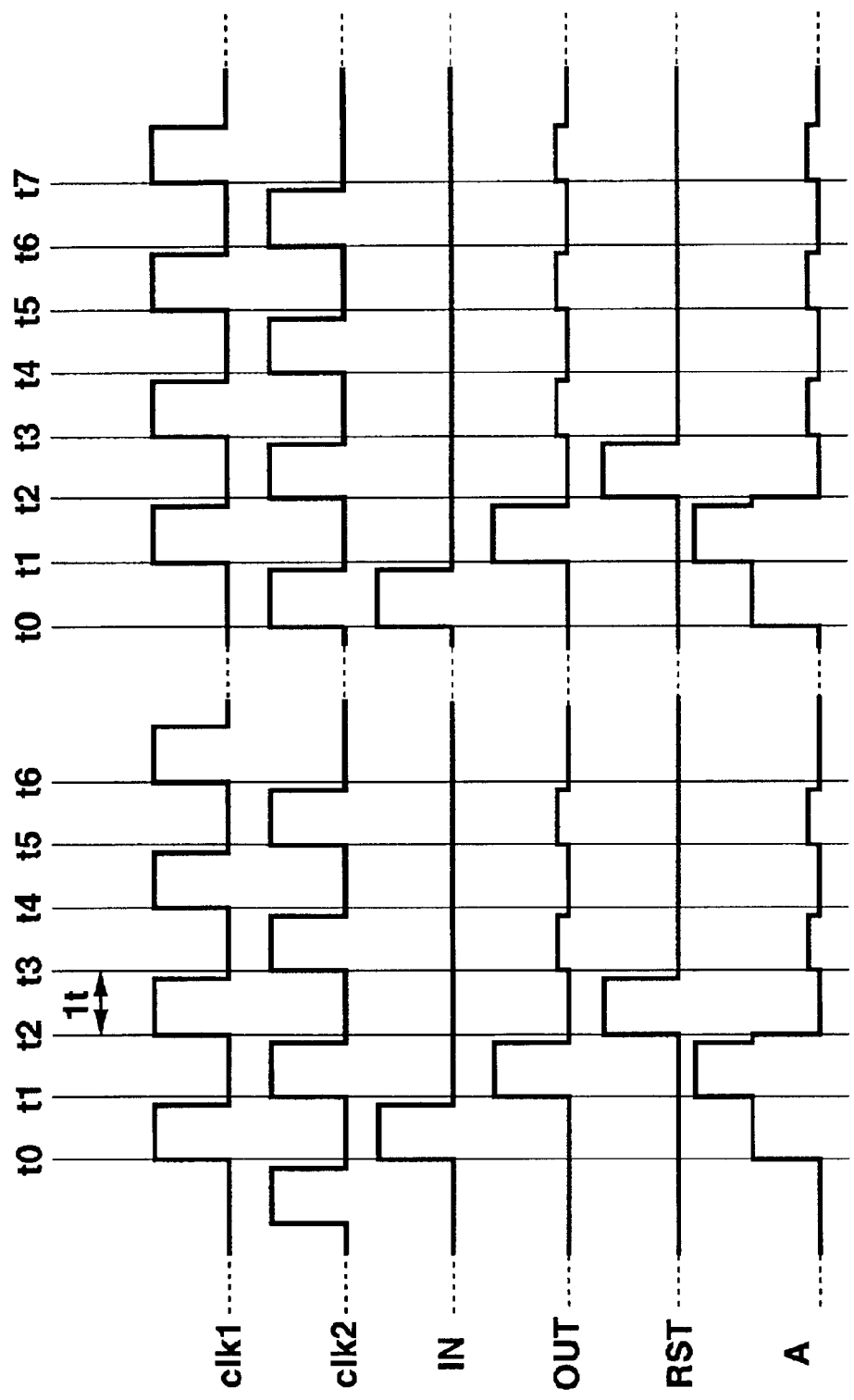
FIG. 9 is a timing chart showing the operation of the top gate driver or bottom gate driver of FIG. 8.

In the stage shown in FIG. 8, when the reset signal turns to the high level, the TFT 22 is turned on and the potential of the node A indicates the reference voltage Vss. Thereafter, when the reset signal turns to the low level, the TFT 22 is turned off, and maintains the off state as long as the reset signal does not next reach the high level. Therefore, from when the reset signal turns to the low level until the signal reaches the high level, the wiring of the node A is in the floating state. In this case, when the clock signal inputted into the clock signal input terminal reaches the high level, the parasitic capacity constituted of the gate and source electrodes of the TFT 24, the gate insulation film between the electrodes is charged up and the potential of the wiring A rises. Then, the leak current flows between the source and drain electrodes of the TFT 24. Therefore, as shown in FIG. 9, in t3 to t4, or t5 to t6, during the driving of another stage, the TFT 24 of the stage is displaced by the high-level clock signal and malfunction of the TFT is caused. Therefore, the driving driver constituted of the stage shown in FIG. 8, and the image pickup apparatus including the driver sometimes cause the malfunction.

On the other hand, in the present embodiment, when the reset signal reaches the high level, the TFT 22 is turned on, and the node A indicates the reference voltage Vss. Thereafter, even when the reset signal turns to the low level, the TFT 22 maintains the on state. Because the TFTs 27 to 32 are disposed in the stage RS(k). Thereafter, when the input signal reaches the high level, the TFT 22 is turned off. Even when the input signal turns to the low level, the TFT 22 maintains the off state. Here, from when the reset signal reaches the high level until the input signal reaches the high level (i.e., between t3 and t0), the clock signal reaches the high level, and then the parasitic capacity constituted of the gate and source electrodes of the TFT 24 and the gate insulation film between the electrodes is charged up. However, the TFT 22 maintains the on state in this period. Therefore, even when the parasitic capacity is charged up, the electric charges are discharged by the TFT 22, and the potential of the node A does not rise. Therefore, in the present embodiment, the leak current does not flow from the TFT 24 by the high level of the clock signal. The level of the output signal terminal OUT is subtle but does not rise. Therefore, power consumptions of the top gate driver 4 and bottom gate driver 5 are prevented from being wasted, and the output signals of the top gate driver 4 and bottom gate driver 5 securely shift.

While the node A is in the high level, and when the clock signal inputted into the TFT 24 reaches the high level, the potential of the node A rises, and the high-level output signal out(k) is outputted from the output signal terminal OUT. Here, since the node A is not connected to elements such as a resistance and capacitor other than the TFTs 21 to 24, the node A securely rises to the gate saturated voltage. Therefore, the drop of the high-level output signal out(k) outputted from the output signal terminal OUT is not caused. Therefore, the output signals of the top gate driver 4 and bottom gate driver 5 in the present embodiment securely shift. Therefore, the stability of the operation of the top gate driver 4 and bottom gate driver 5 is satisfactory.

In the top gate driver 4 and bottom gate driver 5, the high-level clock signals CK1, CK2 from the sages RS(k) are outputted as the output signals out(k) of the stages RS(k) at substantially the same level. Therefore, even when a buffer is not disposed in each stage RS(k), the output signal out(k) can successively shift without attenuating the level of the signal.

Second Embodiment

The image pickup apparatus as a second embodiment will next be described. The constitution of the image pickup apparatus of the second embodiment is substantially the same as the image pickup apparatus 1 of the first embodiment. Additionally, in the second embodiment, the constitution of each stage of the top gate driver 4 and bottom gate driver 5 is different from that of the first embodiment.

Figure 10:
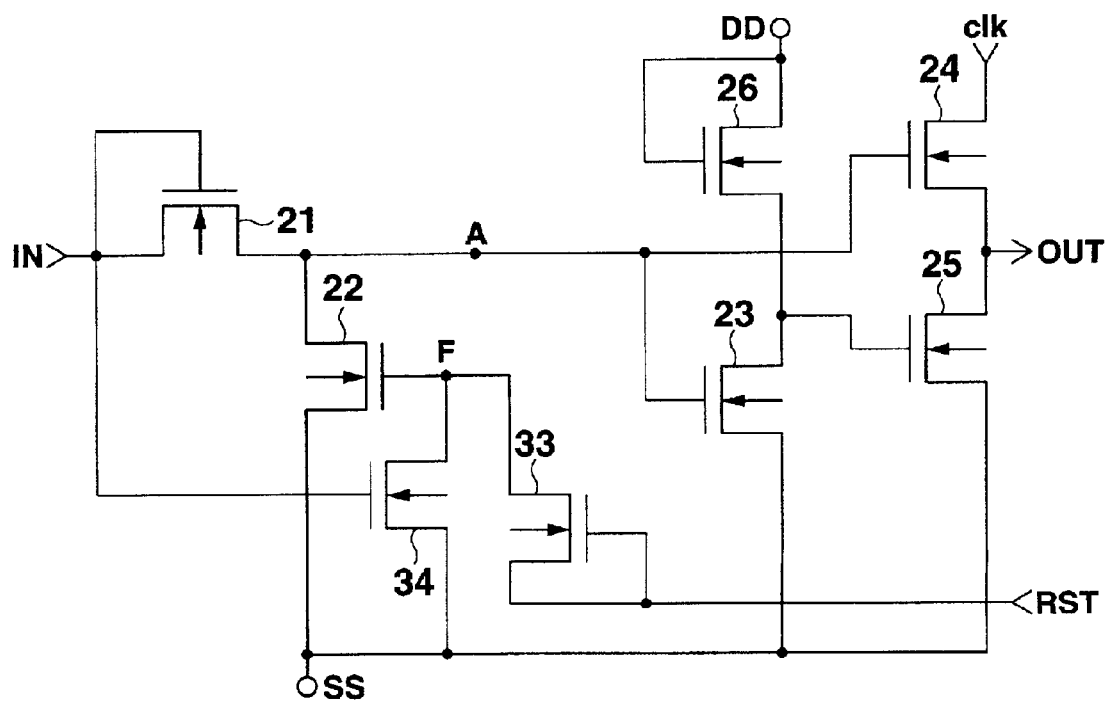
FIG. 10 is a diagram showing another concrete mode of the circuit constitution of each stage of the top gate driver or bottom gate driver to which a shift register according to one embodiment of the present invention is applied.

FIG. 10 is a diagram showing the circuit constitution of the respective stages RS(1) to RS(n) of the top gate driver 4 or the bottom gate driver 5 in the second embodiment. As shown in FIG. 10, each stage includes TFTs 21 to 26 as the basic constitution, and TFTs 33, 34 as the additional constitution. Similarly as the TFTs 21 to 26, the TFTs 33, 34 are n-channel MOS type field-effect transistors.

The connection constitution of the TFTs 21 to 26 is substantially the same as that of the first embodiment. Additionally, in the first embodiment, the gate electrode of the TFT 22 is connected to the source electrode of the TFT 29 and drain electrode of the TFT 28. On the other hand, in the second embodiment, the gate electrode of the TFT 22 is connected to the source electrode of the TFT 33 and drain electrode of the TFT 34. In the wiring connected to the gate electrode of the TFT 22, source electrode of the TFT 33 and drain electrode of the TFT 34, the parasitic capacities are generated among the TFTs 22, 33, 34, and a node F is positioned as an optional point in the wiring.

The drain and gate electrodes of the TFT 33 are connected to the reset signal input terminal RST. Moreover, the gate electrode of the TFT 34 is connected to the input signal terminal IN, and the source electrode of the TFT 34 is connected to the reference voltage applied terminal SS.

The TFTs 21 and 23 to 26 have the functions similar to those of the first embodiment.

When the node F is in the high level, the TFT 22 is turned on, the potential of the node A is set to the reference voltage Vss, and the potential state is maintained. On the other hand, when the node F is in the low level, the TFT 22 is turned off. In a period in which both the TFTs 21 and 22 are in the off state, the wiring of the node A is brought into the floating state, and the potential of the node A can fluctuate.

The reset signal is inputted into the drain and gate electrodes of the TFT 33. In the stage RS(k) other than the dummy stage RS(n+2), the reset signal is the output signal out(k+1) of the subsequent stage RS(k+1). With the dummy stage RS(n+2), the reset signal is the reset signal Vrst outputted from the controller 3.

When the high-level reset signal (i.e., the output signal out(k+1)) is inputted into the embodiment of the TFT 33, the TFT 33 is turned on, and the current flows to the source electrode from the drain electrode. Therefore, the TFT 33 in the on state outputs corresponding high-level reset signal from the source electrode. Here, when the TFT 34 is in the off state, the node F is brought into the high level by the high-level reset signal outputted from the TFT 33. The on/off state of the TFT 34 is controlled by the input signal. That is, when the low-level input signal (i.e., the output signal out(k−1)) is inputted into the gate electrode of the TFT 34, the TFT 34 is turned off. The TFT 34 in the off state obtains a state in which the charges can be accumulated in the wiring of the node F. On the other hand, when the high-level input signal is inputted into the gate electrode of the TFT 34, the TFT 34 is turned off. The TFT 34 in the on state sets the potential of the node F to the reference voltage Vss.

The operation of the image pickup apparatus according to the second embodiment will be described hereinafter. Additionally, the operation of the image pickup apparatus 1 in the first embodiment is different from the operation of the image pickup apparatus in the second embodiment only in the operation of the top gate driver 4 and bottom gate driver 5. The operation of the top gate driver 4 of the second embodiment will be described with reference to FIG. 11. Additionally, in the following description, the even-numbered stages other than the dummy stage RS(n+2) of the top gate driver 4 will be described as examples. Since the operations of the other stages and each stage of the bottom gate driver 5 are substantially the same as those of the even-numbered stages of the top gate drivers 4, the detailed description thereof is omitted.

Figure 11:
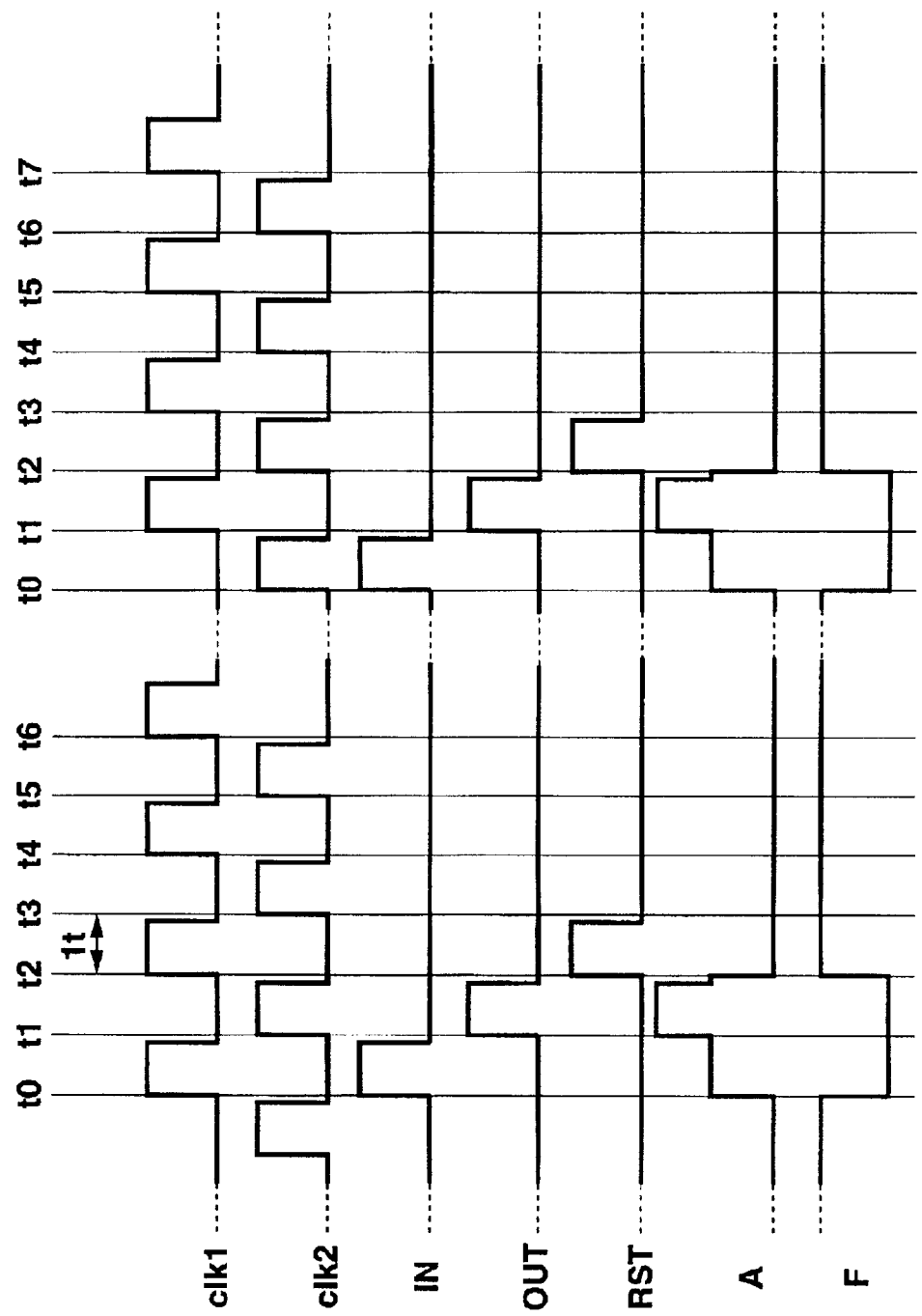
FIG. 11 is a timing chart showing the operation of the top gate driver or bottom gate driver of FIG. 10.

As shown in FIG. 11, at the timing t0, the input signal inputted into the input signal terminal IN (i.e., the output signal out(k−1) of the previous stage RS(k−1)) is brought into the high level, and the TFT 34 is turned on. When the TFT 34 is turned on, the node F indicates the reference voltage Vss, and the TFT 22 is turned off. Moreover, at the timing t0, the TFT 21 is turned on, and the high-level input signal inputted into the drain electrode of the TFT 21 is outputted to the source electrode. Since the TFT 22 is in the off state, the high-level input signal raises the potential of the node A, turns on the TFTs 23, 24, and turns off the TFT 25.

After the timing to and immediately before a timing t1, the input signal turns to the low level, and the TFTs 21, 34 are turned off. In this case, the node F indicates the reference voltage Vss. Therefore, even when the input signal is in the low level, the TFT 22 maintains the off state, and the accumulated state of the charges in the node A is maintained.

Subsequently, at the timing t1 the clock signal CK2 reaches the high level. Then, the parasitic capacity constituted of the gate and source electrodes of the TFT 24 and the gate insulation film between the electrodes is charged up, and the boot strap effect further raises the potential of the node A. Moreover, when the potential of the node A reaches the gate saturated voltage, the current flowing between the drain and source electrodes of the TFT 24 is saturated. Thereby, the output signal out(k) outputted from the output signal terminal OUT of the stage RS(k) indicates substantially the same potential of +25 [V] as that of the clock signal CK2, and is in the high level.

Subsequently, after the timing t1 and immediately before the timing t2, the clock signal CK2 turns to the low level. Thereby, the level of the output signal out(k) is about −15 [V]. Moreover, the electric charges charged into the parasitic capacity of the TFT 24 are discharged, and the potential of the node A drops.

Subsequently, at the timing t2, the reset signal inputted into the reset signal input terminal RST (i.e., the output signal out(k+1) of the subsequent stage RS(k+1)) reaches the high level. Thereby, the TFT 33 is turned on. When the TFT 33 is turned on, the high-level reset signal inputted into the drain electrode of the TFT 33 is outputted to the source electrode. In response to the high-level reset signal outputted to the source electrode, the charges are accumulated in the node F, and the potential of the node F reaches the high level. When the charges are accumulated in the node F, the TFT 22 is turned on. When the TFT 22 is turned on, the node A indicates the reference voltage Vss, and thereby the TFTs 23, 24 are turned off. When the TFT 24 is turned off, the output of the clock signal CK2 inputted into the drain electrode is cut off. When the TFT 23 is turned off, the signal having the constant voltage Vdd level is outputted to the source electrode of the TFT 26, the node E reaches the high level, the TFT 25 is turned on, and thereby the signal having the reference voltage Vss level is outputted as the output signal out(k) of the stage RS(k) from the output signal terminal OUT.

After the timing t2 and immediately before the timing t3, when the reset signal turns to the low level, the TFT 33 is turned off. In this case, since the TFT 34 is in the off state, the state of the charges accumulated in the node F is maintained, and the node F maintains the high level. Thereby, the TFT 22 maintains the on state. Moreover, the TFT 22 maintains the off state, until the input signal next reaches the high level.

When the operation is successively repeated in both the odd-numbered and even-numbered stages, the stage to output the high-level output signal successively shifts to the next stage.

As described above, even in the second embodiment, similarly as the first embodiment, from when the high-level reset signal is inputted until the high-level input signal is inputted, the potential of the node F maintains the high-level state, and thereby the TFT 22 maintains the on state. On the other hand, from when the high-level input signal is inputted until the high-level reset signal is inputted, the node F maintains the low level, and the TFT 22 maintains the off state. Therefore, from when the high-level reset signal is inputted until the high-level input signal is inputted, even with the input of the high-level clock signal into the TFT 24, the potential of the node A does not rise. Therefore, even in the second embodiment, the leak current is inhibited from flowing from the TFT 24 because of the high level of the clock signal. The level of the output signal terminal OUT is slight but does not rise.

Third Embodiment

The image pickup apparatus as a third embodiment will next be described. The constitution of the image pickup apparatus of the third embodiment is substantially the same as the image pickup apparatus 1 of the first embodiment. Additionally, in the third embodiment, the constitution of each stage of the top gate driver 4 and bottom gate driver 5 is different from that of the first embodiment.

Figure 12:
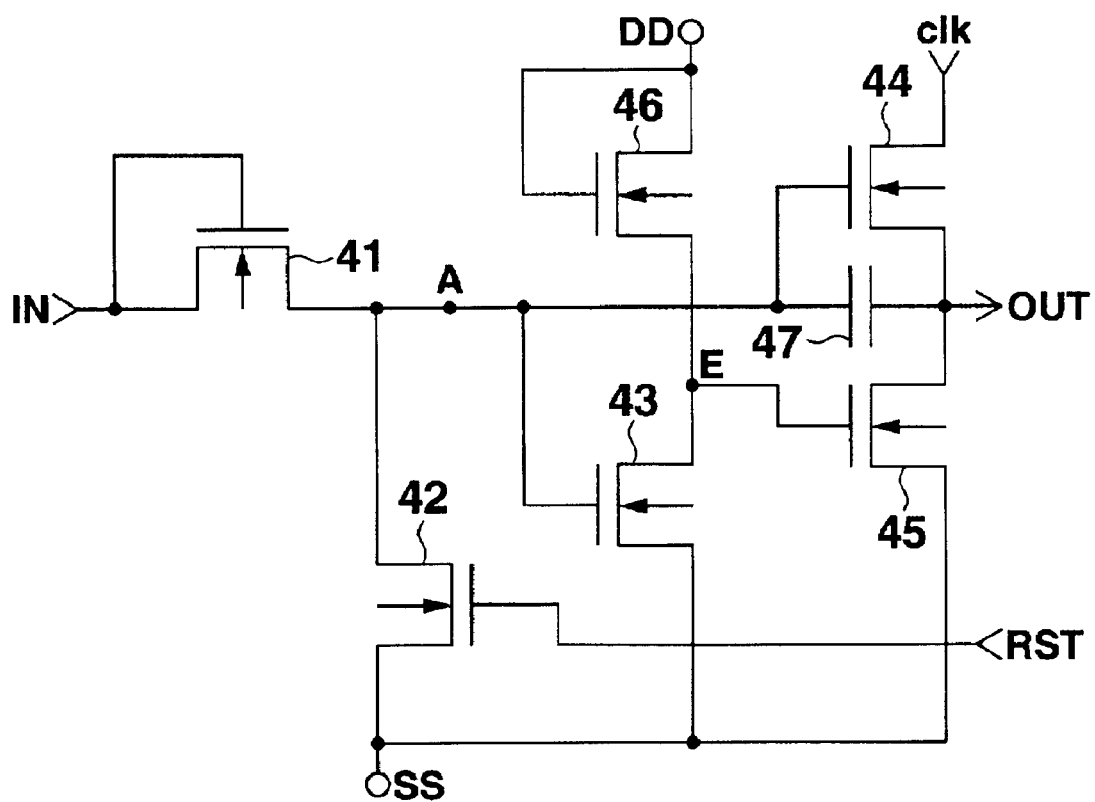
FIG. 12 is a diagram showing another concrete mode of the circuit constitution of each stage of the top gate driver or bottom gate driver to which the shift register according to the present invention is applied.

FIG. 12 is a diagram showing the circuit constitution of the respective stages RS(1) to RS(n) of the top gate driver 4 or the bottom gate driver 5. As shown in FIG. 12, each stage includes TFTs 41 to 46 as the basic constitution, and a capacitor (capacity) 47 as the additional constitution. The TFT 41 corresponds to the TFT 21 in the first embodiment, the TFT 42 corresponds to the TFT 22, the TFT 43 corresponds to the TFT 23, the TFT 44 corresponds to the TFT 24, the TFT 45 corresponds to the TFT 25, and the TFT 46 corresponds to the TFT 26. Similarly as the TFTs 21 to 26, the TFTs 41 to 46 are n-channel MOS type field-effect transistors.

The connection constitution of the TFTs 41 to 46 is substantially the same as that of the first embodiment. Additionally, in the first embodiment, the gate electrode of the TFT 22 is connected to the source electrode of the TFT 29 and drain electrode of the TFT 28. On the other hand, in the third embodiment, the gate electrode of the TFT 42 is connected to the reset signal input terminal RST. Moreover, one pole of the capacitor 47 is connected to the output signal terminal OUT, and the other pole thereof is connected to the wiring connected to the source electrode of the TFT 41, drain electrode of the TFT 42, gate electrode of the TFT 43 and gate electrode of the TFT 44.

The functions of the TFTs 41 and 43 to 46 are similar to those of the TFTs 21 and 23 to 26.

When the reset signal inputted into the gate electrode of the TFT 42 reaches the high level, the TFT 42 is turned on, and the potential of the node A is set to the reference voltage Vss. On the other hand, when the reset signal inputted to the gate electrode of the TFT 42 turns to the low level, the TFT 42 is turned off, and the node A is brought into the floating state.

Here, when the node A of FIG. 12 is in the floating state, a capacity Cp1 on a clock signal potential side having the node A as one end is a sum of the parasitic capacity between the node A and the wiring of the clock signal CK1 or CK2 and the parasitic capacity between the node A and the TFT 44. When the node A is in the floating state, a capacity Cp2 on a reference voltage Vss side having the node A as one end is a sum of the parasitic capacity between the node A and the wiring of the reference voltage Vss, parasitic capacity between the node A and the TFTs 41, 42, 43 and capacity of the capacitor 47. Moreover, a capacity Cp3 on a constant voltage Vdd side having the node A as one end is the parasitic capacity between the node A and the wiring of the constant voltage Vdd. Therefore, when the node A is in the floating state and the high-level clock signal CK1 or CK2 is inputted to the TFT 44, a potential Vf of the node A can be represented in the following equation (1).

$$Vf = \{Ca \times Vdd + (Cb+Cc) \times Vss\}/(Ca+Cb+Cc) \quad (1)$$

That is, when settings of the TFTs 41 to 46 of the present embodiment are equal to those of the TFTs 21 to 46 of FIG. 8, a value Cb of the present embodiment is larger by the capacity of the capacitor 47 as compared with the capacity on the reference voltage Vss side having the node A as one end during the node A in FIG. 8 having the floating state. Therefore, during the floating, the voltage Vf of the node A displaced by the high-level clock signal CK can be lowered.

Figure 13:
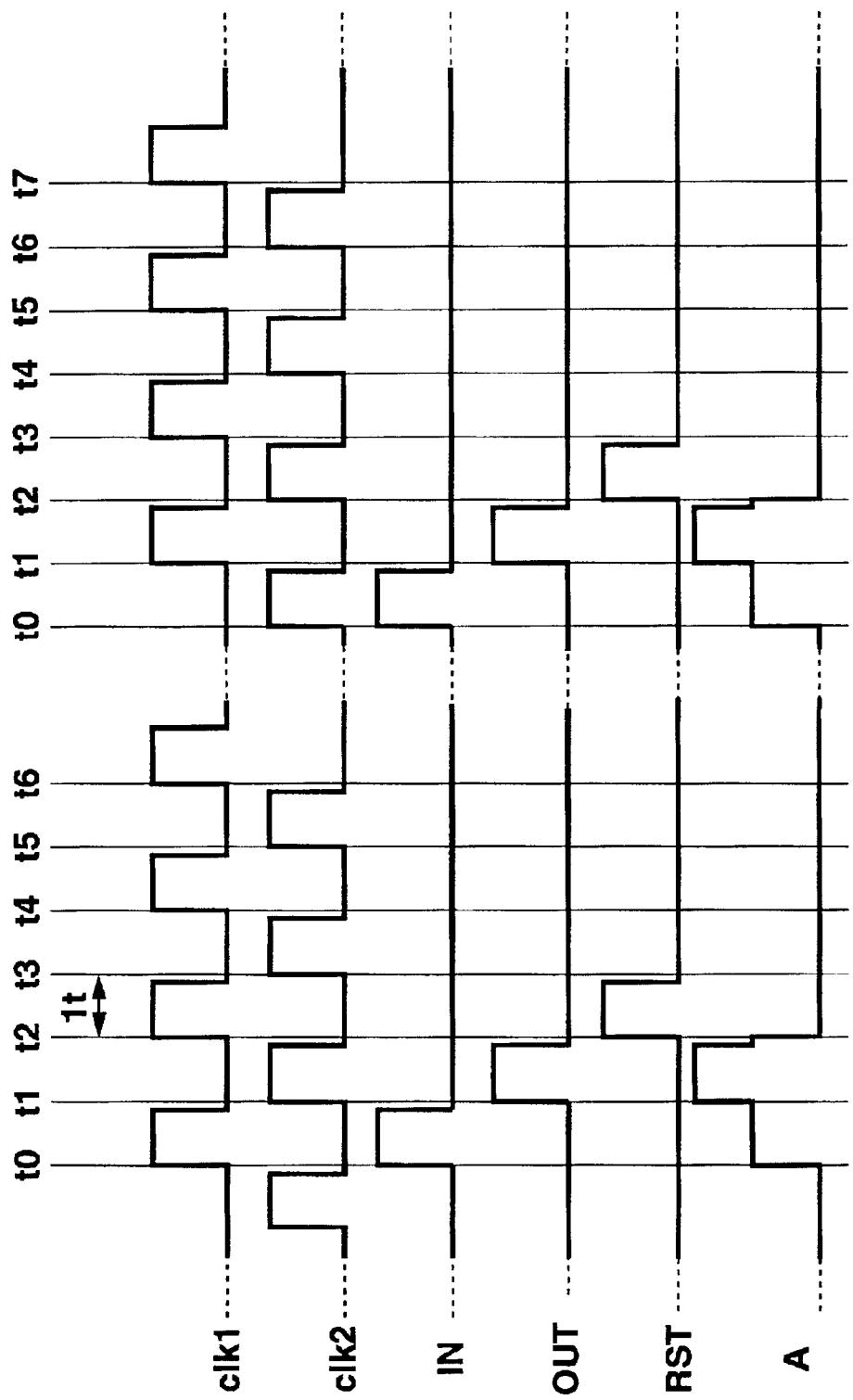
FIG. 13 is a timing chart showing the operation of the top gate driver or bottom gate driver of FIG. 12.

The operation of the image pickup apparatus according to the third embodiment will be described hereinafter. Additionally, the operation of the image pickup apparatus 1 in the first embodiment is different from the operation of the image pickup apparatus in the third embodiment only in the operation of the top gate driver 4 and bottom gate driver 5. The operation of the top gate driver 4 or the bottom gate driver 5 of the third embodiment will be described with reference to FIG. 13. Additionally, in the following description, the even-numbered stages of the top gate driver 4 other than the dummy stage RS(n+2) will be described as examples. Since the operations of the other stages of the top gate driver 4 and each stage of the bottom gate driver 5 are substantially the same as those of the even-numbered stages of the top gate drivers 4 other than the dummy stage RS(n+2), the detailed description thereof is omitted.

At the timing t0, the input signal inputted into the input signal terminal IN (i.e., the output signal out(k−1) of the previous stage RS(k−1)) is brought into the high level, and the TFT 41 is turned on. When the TFT 41 is turned on, the high-level input signal inputted into the drain electrode of the TFT 41 is outputted to the source electrode. In this case, the reset signal inputted into the reset signal input terminal RST (the output signal out(k+1) of the subsequent stage RS(k+1)) is in the low level, the TFT 42 is in the off state. Therefore, at the timing t0, by the high-level input signal outputted from the source electrode of the TFT 41, the potential of the node A rises. When the potential of the node A rises, the TFTs 43, 44 are turned on. When the TFT 43 is turned on, the potential of the node E indicates the reference voltage Vss, and the TFT 45 is turned off. Since the TFTs 44 and 45 are in the on state in this manner, the low-level clock signal inputted into the drain electrode of the TFT 44 is outputted as the output signal out(k) of the stage RS(k) from the output signal terminal OUT.

After the timing t0 and before the timing t1, the input signal turns to the low level, and the TFT 41 is turned off. Also in this case, since the reset signal is in the low level, the TFT 42 is in the off state and the charges are accumulated in the wiring of the node A.

Subsequently, the clock signal CK2 reaches the high level in the timing t1. Then, the parasitic capacity constituted of the gate and source electrodes of the TFT 44 and the gate insulation film between the electrodes is charged up, and the boot strap effect further raises the potential of the node A. Moreover, when the potential of the node A reaches the gate saturated voltage of the TFT 44, the current flowing between the drain and source electrodes of the TFT 44 is saturated. Thereby, the output signal out(k) outputted from the output signal terminal OUT of the stage RS(k) indicates substantially the same potential of +25 [V] as that of the clock signal CK2, and is in the high level. Furthermore, when the high-level output signal out(k) is outputted from the output signal terminal OUT, the potential of one pole as the output signal terminal OUT of the capacitor 47 is the same as the level (+25 [V]) of the clock signal CK2, and the potential of the other pole as the wiring side of the node A of the capacitor 47 is the same as the potential of the node A.

Next, after the timing t1 and immediately before the timing t2, the clock signal CK2 turns to the low level. Thereby, the level of the output signal out(k) is about −15 [V]. Moreover, the electric charges charged into the parasitic capacity of the TFT 44 are discharged, and the potential of the node A drops.

Subsequently, at the timing t2, the reset signal inputted into the reset signal input terminal RST reaches the high level. Thereby, the TFT 42 is turned on. When the TFT 42 is turned on, the potential of the node A indicates the reference voltage Vss, and thereby the TFTs 43, 44 are turned off. When the TFT 44 is turned off, the output of the clock signal CK2 inputted into the drain electrode is cut off. When the TFT 43 is turned off, the signal having the constant voltage Vdd level is outputted to the source electrode of the TFT 46, and the potential of the node E rises. When the potential of the node E rises, the TFT 45 is turned on, and thereby the signal having the reference voltage Vss level is outputted as the output signal out(k) of the stage RS(k) from the output signal terminal OUT. Moreover, since the TFT 45 is in the on state, the potential of one pole of the capacitor 47 on the output signal terminal OUT side is the same (−15 [V]) as the level of the reference voltage Vss.

After the timing t2 and immediately before the timing t3, when the reset signal turns to the low level, the TFT 42 is turned off. Thereby, the TFT 42 is in the off state, and the wiring of the node A is brought into the floating state.

When the operation is successively repeated in both the odd-numbered and even-numbered stages, the stage to output the high-level output signal successively shifts to the next stage.

Figure 14:
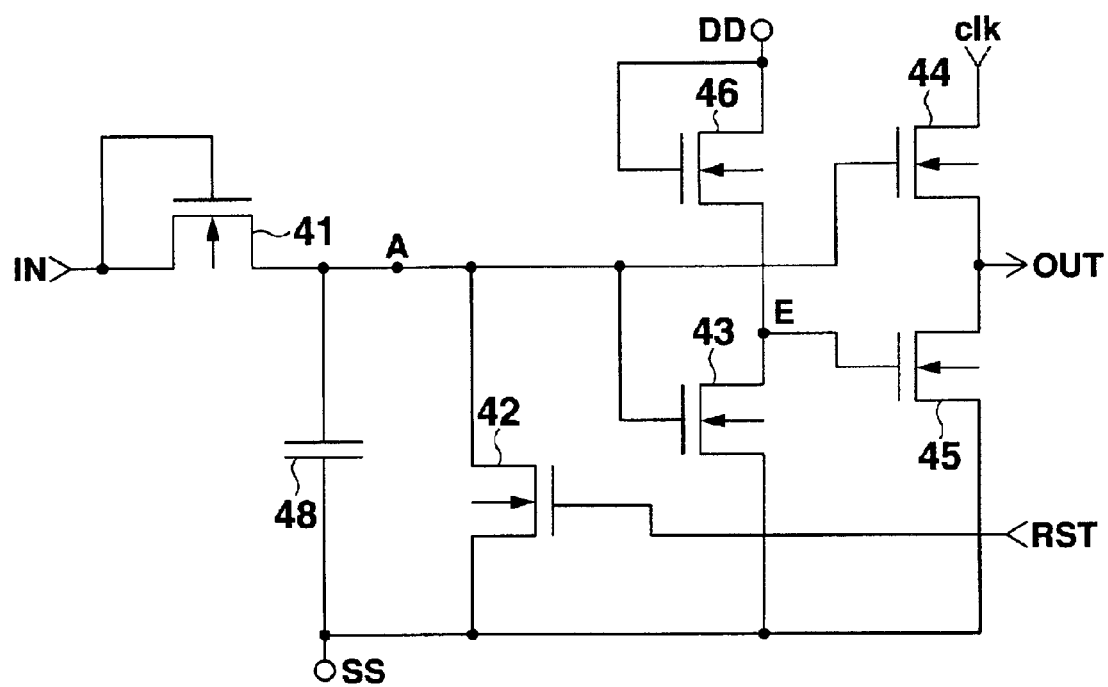
FIG. 14 is a diagram showing the concrete mode of the circuit constitution of each stage of the top gate driver or bottom gate driver as the comparative example.

The effect of the third embodiment will next be described. FIG. 14 is a circuit diagram showing the constitution of one stage of the top gate driver or the bottom gate driver as a comparative example. That is, in each stage of the comparative example, instead of the capacitor 47 of the stage RS(k) in the third embodiment, a capacitor 48 is disposed. One pole of the capacitor 48 is connected to the source electrode of the TFT 41, drain electrode of the TFT 42, gate electrode of the TFT 43 and gate electrode of the TFT 44. The other pole of the capacitor 48 is connected to the reference voltage applied terminal SS.

In the stage shown in FIG. 14, since the other electrode of the capacitor 48 is connected to the reference voltage applied terminal SS, the capacitor 48 has a function of constantly adjusting the amount of charges accumulated in the capacity constantly having the wiring of the node A as one pole, and stabilizing the potential of the node A. Therefore, even when the clock signal reaches the high level (corresponding to t3 to t4, t5 to t6 of FIG. 13), the capacitor 48 suppresses the rise of the potential of the node A. However, immediately after the charges are accumulated in the capacity having the wiring of the node A as one pole, the clock signal reaches the high level (corresponding to t1 to t2 of FIG. 13). Even in this case, the capacitor 48 suppresses the rise of the potential of the node A. Therefore, between t1 and t2, the level of the output signal from the output signal terminal OUT of the stage is lower than the high level of the clock signal, and the output signal of the top gate driver or bottom gate driver does not completely shift in some case.

On the other hand, according to the third embodiment, when the TFT 44 is in the on state (from when the input signal reaches the high level until the reset signal reaches the high level, i.e., between t0 and t2), the TFT 45 is in the off state. Therefore, the potential of one pole of the capacitor 47 on the output signal terminal OUT side is substantially the same as the level of the clock signal. Therefore, while the TFT 44 is in the on state, the capacitor 47 does not act so as to stabilize the potential of the node A. Therefore, in the third embodiment, between t1 and t2, the level of the output signal from the output signal terminal OUT of the stage RS(k) is substantially the same as the high level of the clock signal. That is, the high level of the output signal out(k) of each stage RS(k) in the third embodiment is higher than the high level of the output signal shown in FIG. 14, and the output signals of the top gate driver 4 and bottom gate driver 5 in the third embodiment securely shift.

In the third embodiment, while the TFT 44 is in the off state (from when the reset signal reaches the high level until the input signal reaches the high level, i.e., between t2 and t0), the TFT 45 is in the on state, and therefore the potential of one pole of the capacitor 47 is substantially the same as the level of the reference voltage Vss. Therefore, while the TFT 44 is in the off state, the capacitor 47 adjusts the amount of the charges accumulated in the capacity having the wiring of the node A as one pole, and acts so as to stabilize the potential of the node A. Therefore, even when the clock signal reaches the high level between t2 and t0, the capacitor 47 suppresses the rise of the potential of the node A. Thereby, the leak current does not flow from the TFT 44, and the level of the output signal terminal OUT is slight but does not rise. Therefore, the power consumptions of the top gate driver 4 and bottom gate driver 5 are prevented from being wasted, and the output signals of the top gate driver 4 and bottom gate driver 5 securely shift.

Fourth Embodiment

Figure 15:
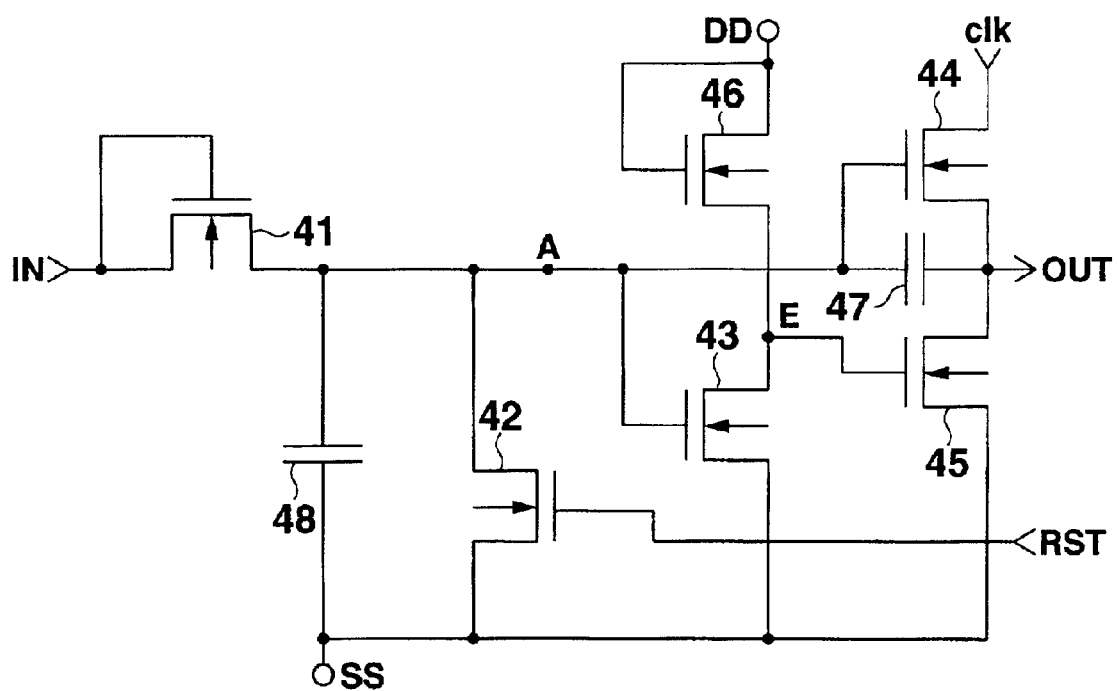
FIG. 15 is a diagram showing another concrete mode of the circuit constitution of each stage of the top gate driver or bottom gate driver.

The image pickup apparatus as a fourth embodiment will next be described. Each stage of the top gate driver 4 or bottom gate driver 5 used in the image pickup apparatus of the fourth embodiment includes a capacitor 48 in addition to the constitution of each stage in the third embodiment, as shown in FIG. 15. One pole of the capacitor 48 is connected to the reference voltage applied terminal SS. The other pole of the capacitor 48 is connected to the source electrode of the TFT 41, the drain electrode of the TFT 42, the gate electrode of the TFT 43, the gate electrode of the TFT 44 and other pole of the capacitor 47. Since one pole of the capacitor 48 is connected to the reference voltage applied terminal SS having a constant potential, the capacitor 48 adjusts the amount of the charges accumulated in the capacity having the wiring of the node A as one pole, and acts so as to stabilize the potential of the node A. Moreover, since the capacitor 47 is disposed, the effect similar to that of the third embodiment is produced.

Fifth Embodiment

Figure 16:
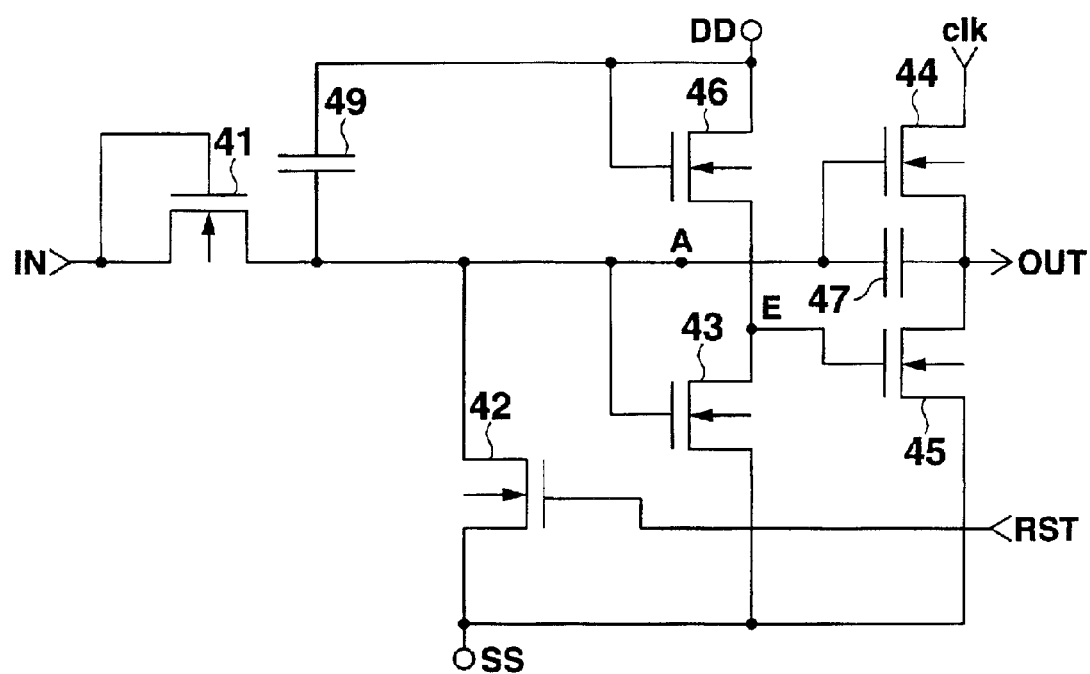
FIG. 16 is a diagram showing another concrete mode of the circuit constitution of each stage of the top gate driver or bottom gate driver.

The image pickup apparatus as a fifth embodiment will next be described. Each stage of the top gate driver 4 or bottom gate driver 5 included in the image pickup apparatus of the fifth embodiment uses a capacitor 49 in addition to the constitution of each stage in the third embodiment, as shown in FIG. 16. One pole of the capacitor 49 is connected to the constant voltage applied terminal DD. The other pole of the capacitor 49 is connected to the source electrode of the TFT 41, the drain electrode of the TFT 42, the gate electrode of the TFT 43, the gate electrode of the TFT 44 and the other pole of the capacitor 47. Since one pole of the capacitor 49 is connected to the constant voltage applied terminal DD having a constant potential, the capacitor 49 adjusts the amount of the charges accumulated in the capacity having the wiring of the node A as one pole, and acts so as to stabilize the potential of the capacity A. Moreover, since the capacitor 47 is disposed, the effect similar to that of the third embodiment is produced.

Sixth Embodiment

Figure 17:
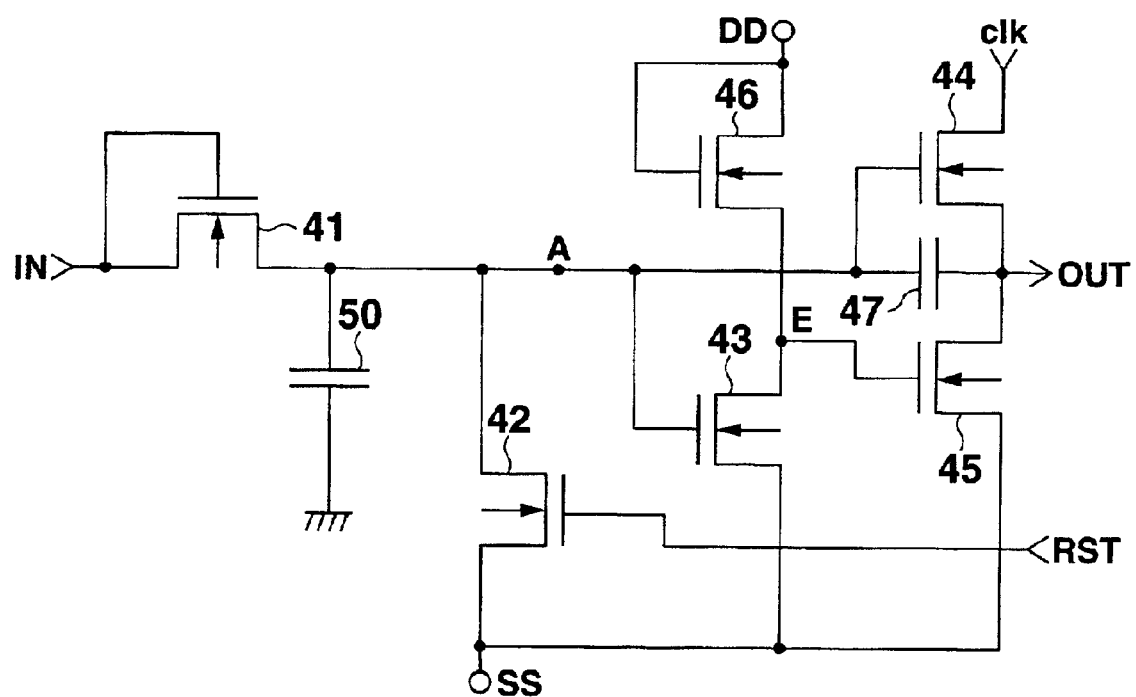
FIG. 17 is a diagram showing another concrete mode of the circuit constitution of each stage of the top gate driver or bottom gate driver.

The image pickup apparatus as a sixth embodiment will next be described. Each stage of the top gate driver 4 or bottom gate driver 5 in the image pickup apparatus of the sixth embodiment includes a capacitor 50 in addition to the constitution of each stage in the third embodiment as shown in FIG. 17. One pole of the capacitor 50 is grounded. The other pole of the capacitor 50 is connected to the source electrode of the TFT 41, the drain electrode of the TFT 42, the gate electrode of the TFT 43, the gate electrode of the TFT 44 and the other pole of the capacitor 47. Since the one electrode of the capacitor 50 is grounded and has a constant potential, the capacitor 50 adjusts the amount of the charges accumulated in the capacity having the wiring of the node A as one pole, and acts so as to stabilize the potential of the node A. Moreover, since the capacitor 47 is provided, the effect similar to that of the third embodiment is produced.

Seventh Embodiment

Figure 18:
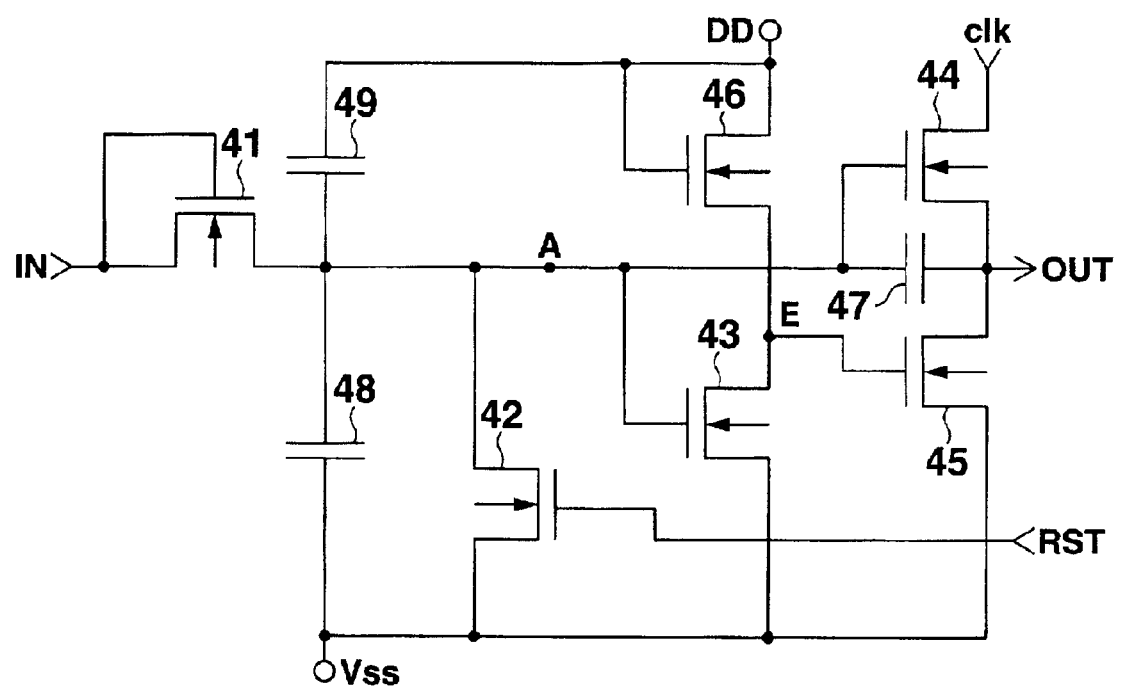
FIG. 18 is a diagram showing another concrete mode of the circuit constitution of each stage of the top gate driver or bottom gate driver.

The image pickup apparatus as a seventh embodiment will next be described. Each stage of the top gate driver 4 or bottom gate driver 5 in the image pickup apparatus of the seventh embodiment includes the capacitor 49 (as shown in FIG. 16) in addition to the constitution of each stage (FIG. 15) in the fourth embodiment, as shown in FIG. 18. One pole of the capacitor 49 is connected to the constant voltage applied terminal DD. The other pole of the capacitor 49 is connected to the source electrode of the TFT 41, the drain electrode of the TFT 42, the gate electrode of the TFT 43, the gate electrode of the TFT 44 and the other pole of the capacitor 47.

Eighth Embodiment

Figure 19:
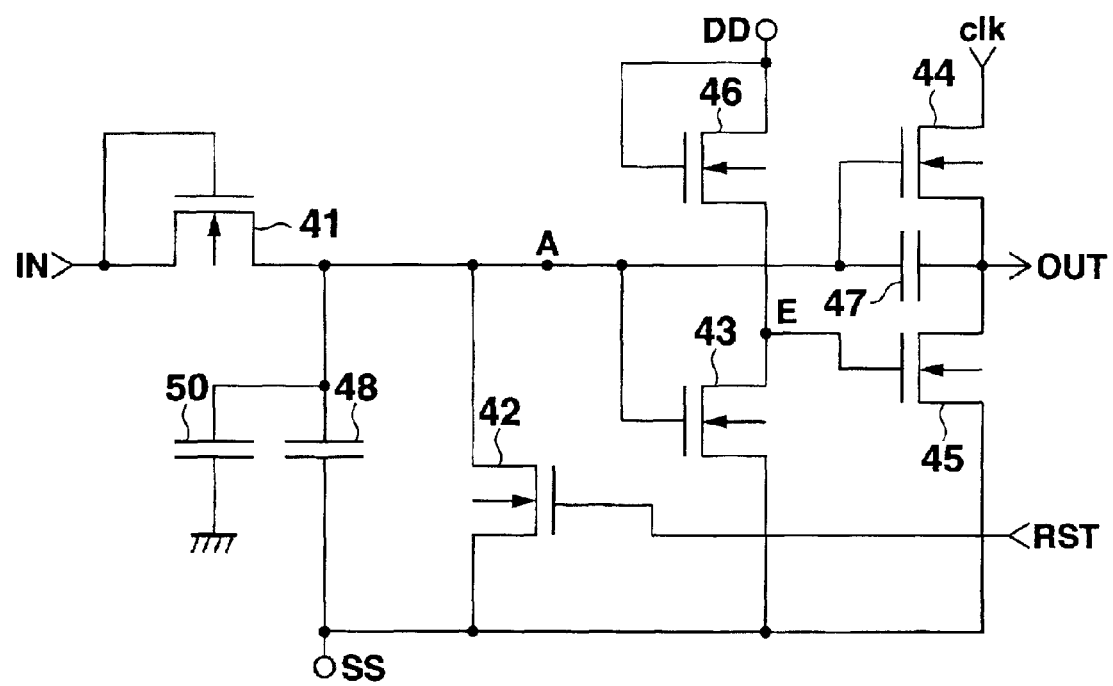
FIG. 19 is a diagram showing another concrete mode of the circuit constitution of each stage of the top gate driver or bottom gate driver.

The image pickup apparatus as an eighth embodiment will next be described. Each stage of the top gate driver 4 or bottom gate driver 5 included in the image pickup apparatus of the eighth embodiment includes the capacitor 50 (as shown in FIG. 17) in addition to the constitution of each stage (FIG. 15) in the fourth embodiment, as shown in FIG. 19. One pole of the capacitor 50 is grounded. The other pole of the capacitor 50 is connected to the source electrode of the TFT 41, the drain electrode of the TFT 42, the gate electrode of the TFT 43, the gate electrode of the TFT 44, the other pole of the capacitor 47 and the other pole of the capacitor 48.

Ninth Embodiment

Figure 20:
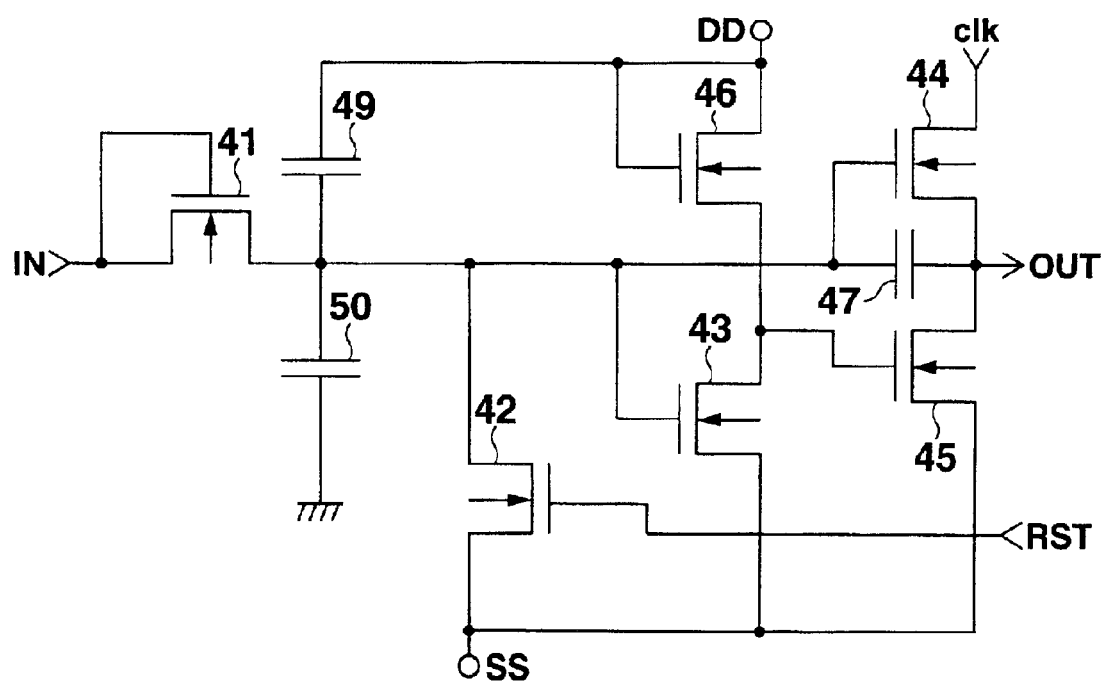
FIG. 20 is a diagram showing another concrete mode of the circuit constitution of each stage of the top gate driver or bottom gate driver.

The image pickup apparatus as a ninth embodiment will next be described. Each stage of the top gate driver 4 or bottom gate driver 5 in the image pickup apparatus of the ninth embodiment includes the capacitor 50 in addition to the constitution of each stage (FIG. 16) in the fifth embodiment, as shown in FIG. 20. One pole of the capacitor 50 is grounded. The other pole of the capacitor 50 is connected to the source electrode of the TFT 41, the drain electrode of the TFT 42, the gate electrode of the TFT 43, the gate electrode of the TFT 44, the other pole of the capacitor 47 and the other pole of the capacitor 49.

Tenth Embodiment

Figure 21:
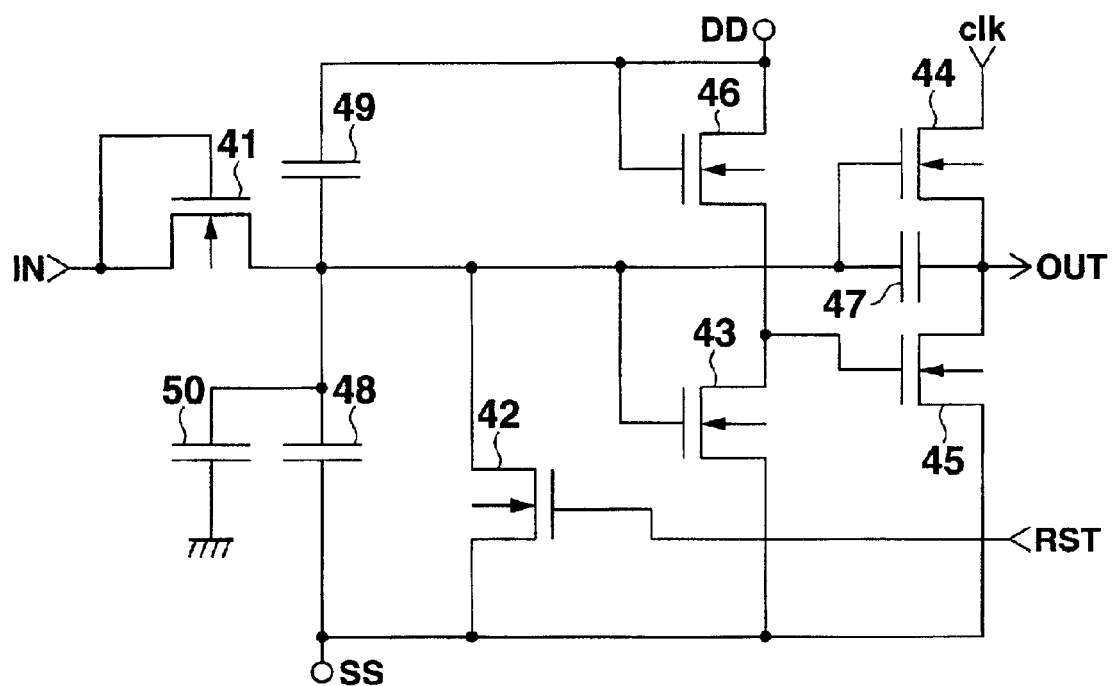
FIG. 21 is a diagram showing another concrete mode of the circuit constitution of each stage of the top gate driver or bottom gate driver.

The image pickup apparatus as a tenth embodiment will next be described. Each stage of the top gate driver 4 or bottom gate driver 5 in the image pickup apparatus of the tenth embodiment includes the capacitor 50 in addition to the constitution of each stage (FIG. 18) in the seventh embodiment, as shown in FIG. 21. One pole of the capacitor 50 is grounded. The other pole of the capacitor 50 is connected to the source electrode of the TFT 41, the drain electrode of the TFT 42, the gate electrode of the TFT 43, the gate electrode of the TFT 44, the other pole of the capacitor 47, the other pole of the capacitor 48 and the other pole of the capacitor 49.

For the above-described image pickup apparatuses in the fourth to tenth embodiments, the constitution other than the respective stages of the top gate driver 4 and bottom gate driver 5 is similar to that of the image pickup apparatus in the third embodiment.

Figure 22:
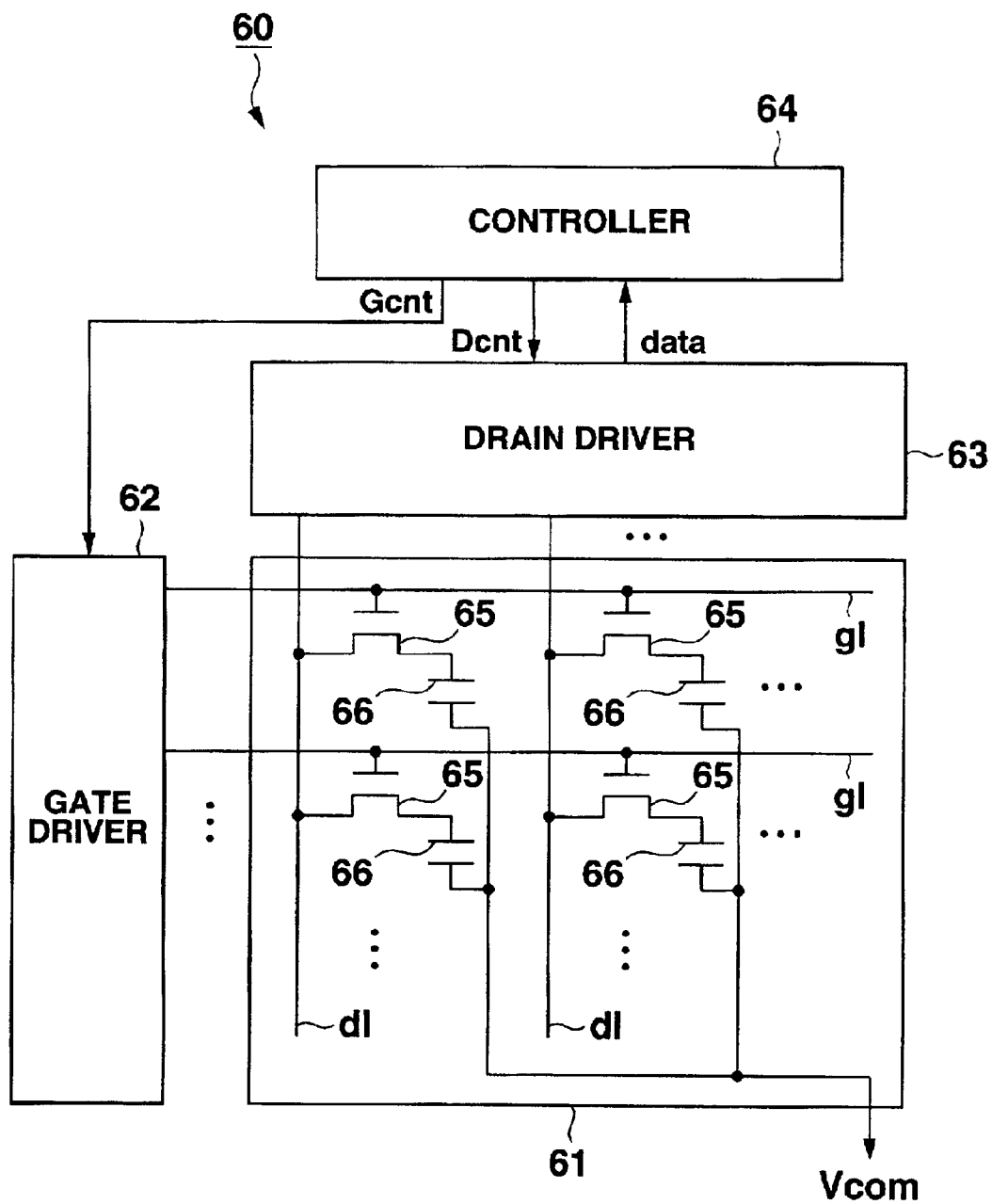
FIG. 22 is a block diagram showing the concrete mode of a liquid crystal display to which the electronic apparatus according to the present invention is applied.

The present invention is not limited to the aforementioned embodiments, and can variously be improved and changed in design without departing from the scope of the invention. For example, in the embodiments, the electronic apparatus of the present invention is applied to the image pickup apparatus, but may be applied to another device such as a display. For example, when the electronic apparatus according to the present invention is applied to a liquid crystal display, as shown in FIG. 22, a liquid crystal display 60 includes a liquid crystal display element 61 for displaying an image, a gate driver 62 and drain driver 63 for driving the liquid crystal display element 61, and a controller 64 for controlling the whole liquid crystal display 60.

The liquid crystal display element 61 includes an array substrate, pixel electrodes arranged in a matrix on the array substrate, a large number of TFTs 65 arranged in the matrix on the array substrate and corresponding to the respective pixel electrodes, an opposite substrate disposed opposite to the array substrate, a liquid crystal layer sealed between the array substrate and the opposite substrate, and a common electrode disposed on the surface of the opposite substrate on a side opposite to the array substrate. The gate electrode of each TFT 65 is connected to a gate line gl, the drain electrode thereof is connected to a drain line (hereinafter referred to as the data line dl), and the source electrode thereof is connected to the pixel electrode. A reference voltage is supplied to the common electrode. A pixel capacity 66 is formed between each pixel electrode and common electrode. Each TFT 65 is used as a switching element for accumulating the charges in the corresponding pixel capacity. In the pixel capacity or capacities in all pixel capacities 66 in which the charges are accumulated, the liquid crystal responds (orientation changes), and the liquid crystal does not respond (the orientation changes) in the pixel capacity or capacities in which the charges are not accumulated. Light is transmitted through the liquid crystal having responded, and is not transmitted through the liquid crystal not having responded. Thereby, the liquid crystal display element 61 controls the amount of light transmitted through the liquid crystal layer and displays the image.

The gate driver 62 is any one of the shift registers applied to the top gate driver 4 and bottom gate driver 5 in the first to tenth embodiments. The gate driver 62 successively supplies a predetermined voltage to gl in response to a control signal Gcnt from the controller 3.

The drain driver 63 successively takes image data data from the controller 3 in response to a control signal Dcnt from the controller 64. When the image data for one line is accumulated, the drain driver 63 outputs the data to the data line DL in response to the control signal Dcnt from the controller 64, and the TFT 65 connected to the data line gl selected in accordance with the gate driver 62 is turned on. Thereby, the charges are accumulated in the pixel capacity 66.

When the image is displayed on the liquid crystal display element 61 in the liquid crystal display 60, first, the gate driver 62 outputs the high-level signal from the stage corresponding to the gate line gl of the row into which the image data is to be written, and turns on the TFT 65 of the row. In the timing in which the TFT 65 of the row is on, the drain driver 63 outputs the voltage corresponding to the accumulated image data to the data line DL, and accumulates the charges in the pixel capacity 66 via the TFT 65 in the on state. By the repetition of the above operation, the orientation state of the liquid crystal corresponding to each pixel capacity 66 changes, and the image is displayed on the liquid crystal display element 61.

In the above-described embodiments, the shift register according to the present invention is applied to the driver for driving the gate driver 62 and liquid crystal display element 61, but can also be applied to other uses. For example, the shift register according to the present invention can also be applied, for example, when series data is converted to parallel data in a data processing apparatus. Moreover, the TFTs 26, 46 are transistors, but may be loads such as resistors, other than the transistors.

Moreover, in the above-described embodiments, all the transistors of the respective stages are of the n-channel type, but may be of a p-channel type. In this case, each signal has a reversed potential.

As described above, according to the present invention, from when the output signal having the predetermined level is inputted to the stage from the previous stage until the output signal having the predetermined level is inputted to the stage from the subsequent stage, without lowering the level of the clock signal, the clock signal can be outputted as the output signal of the stage. On the other hand, from when the output signal having the predetermined level is inputted to the stage from the subsequent stage until the output signal having the predetermined level is inputted to the stage from the previous stage, the output signal having the level raised by the clock signal because of the parasitic capacity of the transistor is not outputted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A shift register comprising a plurality of stages, wherein an output signal having a predetermined level is successively output from each stage of the plurality of stages, each said stage comprising:
    a first transistor which includes a control terminal, a first terminal, and a second terminal, wherein a previous stage output signal is inputted into the first terminal from one of a stage which is one stage before the stage, an external controller and a final stage, and is output via the second terminal if the previous stage output signal has a predetermined level;
    a second transistor which includes a control terminal connected to the second terminal of said first transistor by wiring, a first terminal and a second terminal, wherein the second transistor accumulates charges in a capacity having the wiring connected with the control terminal of said second transistor as one pole by a clock signal inputted into the first terminal of said second transistor and outputs the clock signal as a first output signal of the stage via the second terminal of said second transistor; and
    a potential holding section (i) to displace a potential of said wiring to a predetermined level when a subsequent stage output signal having the predetermined level is inputted from one of a stage which is one stage after the stage, an external controller, and a first stage, and (ii) to hold the potential of said wiring, at the predetermined level until the previous stage output signal having the predetermined level is inputted;
    wherein the potential holding section comprises:
        a third transistor which includes a control terminal, and which displaces the potential of said wiring to the predetermined level in an on states;
        a fourth transistor which includes a control terminal, which output a signal having a predetermined level as an on voltage to the control terminal of said third transistor in response to the subsequent stage output signal, and which stops the output of the on voltage to the control terminal of said third transistor in response to the previous stage output signal; and
        a fifth transistor which includes a control terminal, which outputs a signal having a predetermined level as an off voltage to the control terminal of said third transistor in response to the previous stage output signal, and which stops the output of the voltage to the control terminal of said third transistor in response to the subsequent stage output signal.

2. The shift register according to claim 1, wherein said potential holding section further comprises a sixth transistor which includes a control terminal, and which outputs a signal having a predetermined level as an on voltage to the control terminal of said fourth transistor in response to the subsequent stage output signal.

3. The shift register according to claim 1, wherein said potential holding section further comprises a seventh transistor which includes a control terminal, and which outputs a signal having a predetermined level as an off voltage to the control terminal of said fourth transistor in response to the previous stage output signal.

4. The shift register according to claim 1, wherein said potential holding section further comprises an eighth transistor which includes a control terminal, and which outputs a signal having a predetermined level as an on voltage to the control terminal of said fifth transistor in response to the previous stage output signal.

5. The shift register according to claim 1, wherein said potential holding section further comprises a ninth transistor which includes a control terminal, and which outputs a signal having a predetermined level as an off voltage to the control terminal of said fifth transistor in response to the subsequent stage output signal.

6. A shift register comprising a plurality of stages, wherein an output signal having a predetermined level is successively output from each stage of the plurality of stages, each said stage comprising:
    a first transistor which includes a control terminal, a first terminal, and a second terminal, wherein a previous stage output signal is inputted into the first terminal from one of a stage which is one stage before the stage, an external controller an a final stage, and is output via the second terminal if the previous stage output signal has a predetermined level;
    a second transistor which includes a control terminal connected to the second terminal of said first transistor by wiring, a first terminal and a second terminal, wherein the second transistor accumulates charges in a capacity having the wiring connected with the control terminal of said second transistor as one pole by a clock inputted into the first terminal of said second transistor and outputs the clock signal as a first output signal of the stage via the second terminal of said second transistor;
    a potential holding section (i) to displace a potential of said wince to a predetermined level when a subsequent stage output signal having the predetermined level is inputted from one controller, and a first stage, and (ii) to hold the potential of said wiring at the predetermined level until the previous stage output signal having the predetermined level is inputted;
    wherein said potential holding section comprises:
        a third transistor which includes a control terminal, and which displaces the potential of said wiring to the predetermined level in an on state;
        another transistor which includes a control terminal and which outputs a signal as an on voltage to the control terminal of said third transistor when the subsequent stage output signal is inputted into a first terminal and the control terminal thereof; and a further transistor which includes a control terminal, and which outputs a signal as an off voltage to the control terminal of said third transistor in response to the previous stage output signal.

7. The shift register according to claim 1, further comprising another transistor which includes a control terminal, and which outputs a second voltage as a second output signal of the stage, when a first voltage is supplied to the control terminal thereof.

8. The shift register according to claim 7, further comprising a further transistor which outputs an off voltage to the control terminal of said another transistor in response to the output signal outputted to said wiring from the second terminal of said first transistor.

9. The shift register according to claim 7, further comprising a still further transistor which includes a control terminal, a first terminal and a second terminal, wherein said first voltage is inputted into the first terminal and output to said control terminal of said another transistor via the second terminal.

10. An electronic apparatus comprising:
(i) a shift register comprising a plurality of stages, wherein each stage of the plurality of stages comprises:
a first transistor which includes a control terminal, a first terminal, and a second terminal, wherein a previous stage output signal is inputted into the first terminal from one of a stage which is one stage before the stage, an external controller, and a final stage, and is output via the second terminal if the previous stage output signal has a predetermined level;
a second transistor which includes a control terminal connected to the second terminal of said first transistor by wiring, a first terminal and a second terminal, wherein the second transistor accumulates charges in a capacity having the wiring connected with the control terminal of said second transistor as one pole by a clock signal inputted into the first terminal of said second transistor and outputs the clock signal as an output signal of the stage via the second terminal of said second transistor;
a third transistor which includes a control terminal, and which displaces the potential of said wiring to a predetermined level in an on state;
a fourth transistor which includes a control terminal, and which outputs a signal having a predetermined level as an on voltage to said control terminal of said third transistor in response to a subsequent stage output signal from one of a stage which is one stage after the stage, an external controller, and a first stage; and
a fifth transistor which includes a control terminal, and which outputs a signal having a predetermined level as an off voltage to the control terminal of said third transistor in response to the previous stage output signal; and
(ii) a driven element which is driven by the output signal outputted from the said each stage of said shift register.

11. The electronic apparatus according to claim 10, wherein said driven element comprises an image pickup element.

12. The electronic apparatus according to claim 10, wherein said driven element comprises a double gate type transistor.

13. A shift register comprising a plurality of stages, wherein an output signal having a predetermined level is successively output from each stage of the plurality of stages, each said stage comprising:
a first transistor which includes a control terminal, a first terminal and a second terminal, and which outputs a previous stage output signal inputted into the first terminal of the first transistor from one of a stage which is one stage before the stage, an external controller, and a final stage when the previous stage output signal has a predetermined level and is inputted into the control terminal of the first transistor;
a second transistor which includes a control terminal which is connected to a second terminal of said first transistor by wiring, a first terminal and a second terminal, and which accumulates charges in a capacity having the wiring connected with the control terminal of said second transistor as one pole by a clock signal inputted into the first terminal of said second transistor and outputs the clock signal as a first output signal of the stage via the second terminal of said second transistor;
a third transistor which includes a control terminal, and which outputs a second voltage as a second output signal of the stage, when a first voltage is supplied to the control terminal of the third transistor from a first voltage wiring;
a fourth transistor which outputs an off voltage to the control terminal of said third transistor in response to the output signal outputted to said wiring from the second terminal of said first transistor;
a fifth transistor which displaces a potential of said wiring to a predetermined level in response to a subsequent stage output signal having the predetermined level from one of a stage which is one stage after the stage, an external controller, and a first stage; and
a capacitor disposed between said wiring and the second terminal of said second transistor.

14. The shift register according to claim 13, wherein each said stage comprises a second capacitor disposed between said wiring and a second voltage wiring which supplies said second voltage.

15. The shift register according to claim 13, wherein each said stage comprises a third capacitor disposed between said wiring and said first voltage wiring.

16. An electronic apparatus comprising:
(i) a shift register comprising a plurality of stages, wherein each stage of the plurality of stages comprises:
a first transistor which includes a control terminal, a first terminal and a second terminal, and which outputs a previous stage output signal inputted into the first terminal of the first transistor from one of a stage which is one stage before the stage, an external controller, and a final stage when the previous stage output signal has a predetermined level and is inputted into the control terminal of the first transistor;
a second transistor which includes a control terminal which is connected to a second terminal of said first transistor by wiring, a first terminal and a second terminal, and which accumulates charges in a capacity having the wiring connected with the control terminal of said second transistor as one pole by a clock signal inputted into the first terminal of said second transistor and outputs the clock signal as a first output signal of the stage via the second terminal of said second transistor;
a third transistor which includes a control terminal, and which outputs a second voltage as a second output signal of the stage, when a first voltage is supplied to the control terminal of the third transistor from a first voltage wiring;

a fourth transistor which outputs an off voltage to the control terminal of said third transistor in response to the output signal outputted to said wiring from the second terminal of said first transistor;

a fifth transistor which displaces a potential of said wiring to a predetermined level in response to a subsequent stage output signal having the predetermined level from one of a stage which is one stage after the stage, an external controller, and a first stage; and a capacitor disposed between said wiring and the second terminal of said second transistor; and (ii) a driven element which is driven by the output signals outputted from the respective stages of said shift register.

* * * * *